US 8,963,126 B2

(12) United States Patent
Katz et al.

(10) Patent No.: US 8,963,126 B2
(45) Date of Patent: *Feb. 24, 2015

(54) LOW-VOLTAGE, N-CHANNEL TRANSISTORS INCLUDING A HYBRID SEMICONDUCTOR-DIELECTRIC MATERIAL

(75) Inventors: Howard Edan Katz, Owings Mills, MD (US); Bhola Nath Pal, Baltimore, MD (US); Kevin Cua See, Takoma Park, MD (US); Byung Jun Jung, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 459 days.

This patent is subject to a terminal disclaimer.

(21) Appl. No.: 12/743,977

(22) PCT Filed: Jan. 7, 2009

(86) PCT No.: PCT/US2009/030332

§ 371 (c)(1),
(2), (4) Date: May 20, 2010

(87) PCT Pub. No.: WO2009/089283

PCT Pub. Date: Jul. 16, 2009

(65) Prior Publication Data

US 2011/0024727 A1     Feb. 3, 2011

Related U.S. Application Data

(60) Provisional application No. 61/010,289, filed on Jan. 7, 2008.

(51) Int. Cl.
*H01L 29/08*     (2006.01)
*H01L 35/24*     (2006.01)
(Continued)

(52) U.S. Cl.
CPC .......... *H01L 29/408* (2013.01); *H01L 51/0053* (2013.01); *H01L 51/0533* (2013.01);
(Continued)

(58) Field of Classification Search
None
See application file for complete search history.

(56) References Cited

U.S. PATENT DOCUMENTS 5,976,208 A    11/1999    Rousseau et al.
7,892,454 B2 *    2/2011    Facchetti et al. .............. 252/500
(Continued)

FOREIGN PATENT DOCUMENTS

EP        0010440 A1    4/1980
JP        4-328121 A    12/1992
(Continued)

OTHER PUBLICATIONS

Definition of principal. (n.d.) The American Heritage® Dictionary of the English Language, Fourth Edition. (2003). Retrieved May 28, 2013 from http://www.thefreedictionary.com/principal.*
(Continued)

*Primary Examiner* — Michael Jung
(74) *Attorney, Agent, or Firm* — Venable LLP; Henry J. Daley; Daniel A. Kopp

(57) ABSTRACT

Hybrid semiconducting-dielectric materials and electronic or electro-optic devices using the hybrid semiconducting-dielectric materials. Hybrid semiconducting-dielectric materials comprise molecules that have a core section that provides an n-type semiconducting property and side chains that provide a dielectric property to a layer of hybrid semiconducting-dielectric material. Specific hybrid semiconducting-dielectric materials include tetracarboxylic diimide compounds having sidechains comprising fluorine substituted aliphatic or aromatic moieties linked to the tetracarboxylic diimide structure by an alkylene or heteroalkylene linking group.

7 Claims, 12 Drawing Sheets

(51) Int. Cl.

| | |
|---|---|
| H01L 51/00 | (2006.01) |
| H01L 29/40 | (2006.01) |
| H01L 51/05 | (2006.01) |
| H01G 9/00 | (2006.01) |
| H01G 9/022 | (2006.01) |
| H01G 9/045 | (2006.01) |
| H01L 51/10 | (2006.01) |
| C07D 333/50 | (2006.01) |
| C07D 409/00 | (2006.01) |
| C07D 495/22 | (2006.01) |

(52) U.S. Cl.
CPC .............. *H01L51/0558* (2013.01); *H01G 9/00* (2013.01); *H01G 9/022* (2013.01); *H01G 9/045* (2013.01); *H01L 29/401* (2013.01); *H01L 51/102* (2013.01)
USPC .................. 257/40; 257/E51.007; 549/41

(56) References Cited

U.S. PATENT DOCUMENTS

| | | | | |
|---|---|---|---|---|
| 2006/0237712 | A1* | 10/2006 | Shukla et al. | 257/40 |
| 2007/0096084 | A1 | 5/2007 | Shukla et al. | |
| 2007/0111371 | A1 | 5/2007 | Ahn et al. | |
| 2007/0116895 | A1 | 5/2007 | Shukla et al. | |
| 2007/0160905 | A1 | 7/2007 | Morishita et al. | |
| 2008/0054258 | A1* | 3/2008 | Koenemann et al. | 257/40 |
| 2008/0061288 | A1 | 3/2008 | Tomono et al. | |
| 2009/0072224 | A1 | 3/2009 | Aramaki et al. | |

FOREIGN PATENT DOCUMENTS

| | | |
|---|---|---|
| KR | 10-0559056 B1 | 3/2006 |
| WO | WO-2007/075965 A2 | 7/2007 |
| WO | WO-2008/085942 A2 | 7/2008 |

OTHER PUBLICATIONS

International Search Report and Written Opinion dated May 29, 2009 issued in International Application No. PCT/US2009/030332.
Ando et al., Journal of the American Chemical Society 2005, 127, 14996-14997.
Anthony, J. E. "Functionalzed acenes and heteroacenes for organic electronics", Chem. Rev., vol. 106, pp. 5028-5048, 2006.
Austin et al., "Fabrication of 70 nm channel length polymer organic thin-film transistors using nanoimprint lithography," Applied Physics Letters 81, 4431 (2002).
Babel et al., Journal of the American Chemical Society 2003, 125, 13656-13657.
Bao et al., Journal of the American Chemical Society 1998, 120, 207-208.
Baude et al., "Pentacene-based radio-frequency identification circuitry," Applied Physics Letters 82, 3964 (2003).
Bendikov et al., "Tetrathiafulvalenes, oligoacenenes, and their buckminsterfullerene derivatives: the brick and mortar of organic electronics", Chem. Rev., vol. 104, pp. 4891-4945, 2004.
Briseno et al., Nano Letters 2007, 7, 2847-2853.
Bourguiga et al., European Physical Journal-Applied Physics 2002, 19, 117-122.
Cai et al., Journal of Physical Chemistry B 2006, 110, 14590-14597.
Carroll et al., "Redox modulation of benzene triimides and diimides via noncovalent interactions", Org. Lett, vol. 5, pp. 3177-3180, 2003.
Chen et al., Solar Energy Materials and Solar Cells 2005, 87, 521-527.
Chen et al., "Air stable n-channel organic semiconductors for thin film transistors based on fluorinated derivatives of perylene diimides," Chemistry of Materials 19, 816-824 (2007).
Chesterfield et al., "Organic thin film transistors based on N-alkyl perylene diimides: Charge transport kinetics as a function of gate voltage and temperature," Journal of Physical Chemistry B 108, 19281 (2004).

Collet et al., "Low-voltage, 30 nm channel length, organic transistors with a self-assembled monolayer as gate insulating films," Applied Physics Letters 76, 1941 (2000).
Crone et al., "Large-scale complementary integrated circuits based on organic transistors", Nature, vol. 403, pp. 521-523, 2000.
deLeeuw et al., "Stability of n-type doped conducting polymers and consequences for polymeric microelectronic devices," Synthetic Metals 87, 53 (1997).
Dürr et al., Appl. Phys. Lett. 2002, 81, 2276.
Dimitrakopoulos, P. R. L Malenfant, Adv. Mater. 2002, 14, 99-117.
Gao et al., "Dibenzotetrathiafulvalene bisimides: new building blocks for organic electronic materials", Adv. Mater, vol. 19, pp. 3037-3042, 2007.
Gelinck et al., "Flexible active-matrix displays and shift registers based on solution-processed organic transistors," Nature Materials 3, 106 (2004).
Ghosh et al., Journal of the American Chemical Society 1994, 116, 1932-1940.
Haddock et al., "A comprehensive study of short channel effects in organic field-effect transistors," Organic Electronics 7, 45 (2006).
Handa et al., J. Am. Chem. Soc. 2007, 129, 11684-11685.
Hizu et al., "Reduction in orperation voltage of complementary organic thin-film transistor inverter circuits using double-gate structures", Applied Physics Letter, vol. 90, pp. 093504-1-093504-3, 2007.
Horowitz et al., Synth. Met. 2001, 122, 185-189.
Horowitz et al., J. Appl. Phys. 2000, 87, 4456-4463.
Hosoi et al., "Air-stable n-channel organic field-effect transistors based on N,N'-bis(4-trifluoromethylbenzyl)perylene-3,4,9,10-tetracarboxylic diimide," Chemical Physics Letters 436, 139 (2007).
Huang et al., "Hydroxy-terminated organic semiconductor-based field-effect transistors for phosphonate vapor detection", J. Am. Chem. Soc., vol. 129, 9366-9376, 2007.
Huttner et al., "n-type organic field effect transistors from perylene bisimide block copolymers and homopolymers," Applied Physics Letters 92 (2008).
Ie et al., Organic Letters 2007, 9, 2115-2118.
Inoue et al., Japanese Journal of Applied Physics Part 1—Regular Papers Short Notes & Review Papers 2005, 44, 3663-3668.
Jones et al., "Cyanonaphthalene diimide semiconductors for air-stable, flexible, and optically transparent n-channel field-effect Transistors", Chemistry of Materials, vol. 19, No. 11, pp. 2703-2705, 2007.
Jones et al., "High-mobility air-stable n-type semiconductors with processing versatility: dicyanoperylene-3,4:9,10-bis(dicarboximides)", Angew. Chem. Int. Ed., vol. 43, pp. 6363-6366, 2004.
Jones et al., "Tuning orbital energentics in arylene diimide semiconductors. Materials design for ambient stability of n-type charge transport", J. Am. Chem. Soc., vol. 129, pp. 15259-15278, 2007.
Kao et al., "High-performance bottom-contact devices based on an air-stable n-type organic semiconductor N,N-bis(4-trifluoromethoxybenzy1)-1,4,5,8-naphthalene-tetracarboxylic di-imide," Applied Physics Letters 90 (2007).
Kato et al., "Pyromellitic Diimide-Based Macrocycle with a Linear [pi]-Electronic System and Bis(phenylethynyl)pyromellitic Diimide: Syntheses, Structures, Photophysical Properties, and Redox Characteristics(1)",Journal of Organic Chemistry, vol. 73, No. 11, pp. 4063-4075, (2008).
Katz et al., "A soluble and air-stable organic semiconductor with high electron mobility", Nature, vol. 404, pp. 478-481, 2000.
Katz et al., "Synthetic chemistry for ultrapure, processable, and high-mobility organic transistor semiconductors", Acc. Chem. Res., vol. 34, pp. 259-369, 2001.
Katz et al., Chemistry Letters 2003, 32, 508-509.
Katz et al., Chem. Phys. Chem. 2001, 2, 167-172.
Katz et al., "Naphthalenetetracarboxylic diimide-based n-channel transistor semiconductors: Structural variation and thiol-enhanced gold contacts," Journal of the American Chemical Society 122, 7787-7792 (2000).
Kelley et al., "Recent progress in organic electronics: materials, devices, and processes," Chem. of Mater., vol. 16, pp. 4413, 2004.

(56) References Cited

OTHER PUBLICATIONS

Kitamura et al., "Low-voltage-operating complementary inverters with C60 and pentacene transistors on glass substrates," Applied Physics Letters 91 (2007).
Klauk et al., "Ultralow-power organic complementary circuits," Nature 445, 745 (2007).
Kobayashi et al., Nat. Mater. 2004, 3, 317.
Kojima et al., Chemistry Letters 2007, 36, 1198-1199.
Kumaki et al., Appl. Phys. Lett. 2007, 90, 053506.
Laquindanum et al., "n-channel organic transistor materials based on naphthalene frameworks," Journal of the American Chemical Society 118, 11331 (1996).
Lee et al., "Solution-processed naphthalene diimide derivatives as n-type semiconductor materials," Journal of Physical Chemistry C 112, 1694 (2008).
Letizia et al., Journal of the American Chemical Society 2005, 127, 13476-13477.
Ling et al., "Air-stable n-channel organic semiconductors based on perylene diimide derivatives without strong electron withdrawing groups," Advanced Materials 19, 1123 (2007).
Ling et al., "Complementary inverter using high mobility air-stable perylene di-imide derivatives," Applied Physics Letters 90 (2007).
Malenfant et al., "N-type organic thin-film transistor with high field-effect mobility based on a N,Nidialky1-3,4,9,10-perylene tetracarboxylic diimide derivative," Applied Physics Letters 80, 2517 (2002).
Mamada et al., Chenmistry of Materials 2007, 19, 5404-5409.
Mitzi et al., Nature 2004, 428, 299-303.
Mori " Molecular materials for organic field-effect transistors", J. Phys.: Condens Matter, vol. 20, No. 184010, pp. 1-13, 2008.
Na, J. H.; Kitamura, M.; Arakawa, Y. Appl. Phys. Lett. 2007, 91, 193501.
Naraso et al., Journal of the American Chemical Society 2006, 128, 9598-9599.
Nishida et al., Organic Letters 2004, 6, 2007-2010.
Nolde et al., "Synthesis and self-organization of core-extended perylene tetracarboxdiimides with branched alkyl substituents," Chemistry of Materials 18, 3715 (2006).
Oh et al., "Air-stable n-channel organic thin-film transistors with high field-effect mobility based on N, N'-bis(heptafluorobutyl)-3,4:9,10-perylene diimide", Appl. Phys. Lett., vol. 91, pp. 212107-1-212107-3, 2007.
Parashkov et al., "Large area electronics using printing methods," Proceedings of the IEEE, vol. 93, No. 7, pp. 1321-1329, 2005.
Park et al., "Electrically stable organic thin-film transistors and circuits using organic/inorganic double-layer insulator," Japanese Journal of Applied Physics Part 1—Regular Papers Brief Communications & Review Papers 46, 2640 (2007).
Richardson "Thermochemical interpretation of electrode potentials for transition-metal complexes", Inorg. chem., vol. 29, pp. 3213-3217, 1990.
Roger et al., "Core-tetrasubstituted naphthalene diimides: Synthesis, optical properties, and redox characteristics," Journal of Organic Chemistry 72, 8070 (2007).
Schlettwein et al., Journal of Physical Chemistry B 2001, 105, 4791-4800.
Schmidt et al., "Core-fluorinated perylene bisimide dyes: air stable n-channel organic semiconductors for thin film transistors with exceptionally high on-to-off current ratios", Adv. Mater., vol. 19, pp. 3692-3695, 2007.
Scudiero et al., "Scanning tunneling microscopy, orbital-mediated tunneling spectroscopy, and Itraviolet photoelectron spectroscopy of metal(II) tetraphenylporphyrins deposited from vapor", J. Am. Chem. Soc., vol. 123, pp. 4073-4080, 2001.
See et al., "Easily synthesized naphthalene tetracarboxylic diimide semiconductors with high electron mobility in air", Chem. Mater., vol. 20, pp. 3609-3616, 2008.
Sekitani et al., "A large-area wireless power transmission sheet using printed organic transistors and plastic MEMs switches," Nature Materials, vol. 6, pp. 413-417, 2007.
Shi et al., Adv. Funct. Mater. 2007, 17, 397-400.
Shimoda et al., Nature 2006, 440, 784-786.
Singh et al., "Soluble derivatives of perylene and naphthalene diimide for n-channel organic field-effect transistors," Organic Electronics 7, 480 (2006).
Sirringhaus, Adv. Mater. 2005, 17, 2411-2425.
Someya et al, "Conformable, flexible, large-area networks of pressure and thermal sensors with organic transistor active matrixes," Proceedings of the National Academy of Sciences (USA), vol. 102, pp. 12321, 2005.
Steudel et al., "50MHz rectifier based on an organic diode," Nature Materials, vol. 4, pp. 597-600, 2005.
Steudel et al., "Comparison of organic diode structures regarding high-frequency rectification behavior in radio-frequency identification tags," Journal of Applied Physics, vol. 99, pp. 114519-1-114519-7, 2006.
Tatemichi et al., "Low-voltage, high-gain, and high-mobility organic complementary inverters based on N,N'-ditridecy1-3,4,9,10-perylenetetracarboxylic diimide and pentacene," Physica Status Solidi-Rapid Research Letters 2, 47 (2008).
Tatemichi et al., "High mobility n-type thin-film transistors based on N,N'-ditridecyl perylene diimide with thermal treatments," Applied Physics Letters 89 (2006).
Thalacker et al., "Synthesis and optical and redox properties of core-substituted naphthalene diimide dyes," Journal of Organic Chemistry 71, 8098 (2006).
Thompson et al., "Communications to the editor", Macromolecules, vol. 38, pp. 5359-5362, 2005.
Torsi et al., "An Analytical Model for Short-Channel Organic Thin-Film Transistors," Journal of Applied Physics 78, 1088 (1995).
Tsukagoshi et al., "Suppression of short channel effect in organic thin film transistors," Applied Physics Letters 91 (2007).
Wang et al., "Anthracenedicarboximides as air-stable n-channel semiconductors for thin-film transistors with remarkable current on-off ratios", J. Am. Chem. Soc., vol. 129, pp. 13362-13363, 2007.
Weitz et al., "Organic n-channel transistors based on core-cyanated perylene caorboxylic diimide derivatives", J. Am. Chem. Soc., vol. 130, pp. 4637-4645, 2008.
Wurthner et al., Organic Letters 2006, 8, 3765-3768.
Yang et al., "Ultrathin organic transistors for chemical sensing", Applied Physics Letters, vol. 90, pp. 263506-1-263506-3, 2007.
Yoo et al., "Organic complementary D flip-flops enabled by perylene diimides and pentacene," Ieee Electron Device Letters 27, 737 (2006).
Yoon et al., Journal of the American Chemical Society 2005, 127, 1348-1349.
Yoon et al., Chem. Mater. 2007, 19, 4864-4881.
Yoon et al., Journal of the American Chemical Society 2006, 128, 5792-5801.
Zhan et al., A high-mobility electron-transport polymer with broad absorption and its use in field-effect transistors and all-polymer solar cells, Journal of the American Chemical Society 129, 7246 (2007).
Zhang et al., "30 nm channel length pentacene transistors," Advanced Materials 15, 1632 (2003).
Zhang et al., Applied Physics Letters 2007, 91.
Zheng et al., "Pyromellitic Diimides: Minimal Cores for High Mobility n-Channel Transistor Semiconductors", Journal of the Americal Chem. Society, vol. 130, No. 44, pp. 14410-14411, (2008).
Zhou et al., "All-organic active matrix flexible display," Applied Physics Letters 88 (2006).
International Search Report and Written Opinion issued in International Application No. PCT/US2009/051265 dated Mar. 11, 2010.

* cited by examiner

| $T_s$ | Subst. Treatment | $\mu \left[\frac{cm^2}{V \cdot s}\right]$ | Max $\mu \left[\frac{cm^2}{V \cdot s}\right]$ | Vth [V] | Max On/off | # devices tested |
|---|---|---|---|---|---|---|
| 100 | P | .15±.01 | .16 | 9-31V | $10^7$ | 8 |
| 100 | O | .21±.01 | .22 | 10-36 | $10^6$ | 12 |
| 100 | F | .20±.04 | .24 | 9-47 | $10^6$ | 7 |
| 120 | P | .28±.03 | .34 | 9-16 | $10^8$ | 12 |
| 120 | O | .35±.04 | .41 | 18-46 | $10^7$ | 12 |
| 120 | F | .26±.01 | .27 | 12-19 | $10^7$ | 6 |
| 140 | P | .26±.06 | .39 | 8-39V | $10^7$ | 7 |
| 140 | O | .30±.09 | .57 | 13-48 | $10^7$ | 11 |
| 140 | F | .25±.10 | .53 | 32-47 | $10^7$ | 11 |

FIG. 9

LOW-VOLTAGE, N-CHANNEL TRANSISTORS INCLUDING A HYBRID SEMICONDUCTOR-DIELECTRIC MATERIAL

CROSS-REFERENCE TO RELATED APPLICATION

This application is a National Stage Application of International Application No. PCT/US2009/030332 filed Jan. 7, 2009, which claims priority to U.S. Provisional Application No. 61/010,289 filed Jan. 7, 2008, the entire contents of both of which are hereby incorporated by reference in their entirety.

This invention was made using U.S. Government support under AFOSR Grant No. FA9550-06-1-0076 and DOE Grant No. 37420-001-06. The U.S. Government has certain rights in this invention.

BACKGROUND

1. Field of Invention

The current invention relates to materials for electronic and/or electro-optic devices and devices using the materials, in particular to hybrid semiconducting-dielectric materials and devices using the hybrid semiconducting-dielectric materials.

2. Discussion of Related Art

Performance of organic field-effect transistors (OFET) at voltages <10 V is limited by the nature of the typical gate dielectrics. These dielectrics typically have capacitance in the range of 1-20 $nF/cm^2$ because they are designed for minimum leakage current at absolute applied voltages of 100 V. The most commonly used dielectric materials are thermally grown silicon oxide and spincoated vinyl polymers. OFETs using these gate dielectrics require tens of volts on the gate to achieve on/off ratios >1000. In addition, the source-drain separation (device length L) must be at least one micron to avoid short channel effects that also reduce modulation. (J. N. Haddock, X. H. Zhang, S. J. Zheng, Q. Zhang, S. R. Marder, and B. Kippelen, "A comprehensive study of short channel effects in organic field-effect transistors," Organic Electronics 7, 45 (2006); M. D. Austin and S. Y. Chou, "Fabrication of 70 nm channel length polymer organic thin-film transistors using nanoimprint lithography," Applied Physics Letters 81, 4431 (2002); J. Collet, O. Tharaud, A. Chapoton, and D. Vuillaume, "Low-voltage, 30 nm channel length, organic transistors with a self-assembled monolayer as gate insulating films," Applied Physics Letters 76, 1941 (2000); L. Torsi, A. Dodabalapur, and H. E. Katz, "An Analytical Model For Short-Channel Organic Thin-Film Transistors," Journal Of Applied Physics 78, 1088 (1995); K. Tsukagoshi, F. Fujimori, T. Minari, T. Miyadera, T. Hamano, and Y. Aoyagi, "Suppression of short channel effect in organic thin film transistors," Applied Physics Letters 91 (2007). Y. J. Zhang, J. R. Petta, S. Ambily, Y. L. Shen, D. C. Ralph, and G. G. Malliaras, "30 nm channel length pentacene transistors," Advanced Materials 15, 1632 (2003).) Larger gate lengths severely limit accessible switching speed, which is inversely proportional to ($L^2$).

Particular advances in circuit technology include greatly reduced power consumption through high-capacitance gates and greater complexity from advanced patterning methods. For example, the combination of alumina and an overlying phosphonic acid self-assembled monolayer as a gate dielectric led to 1-V transistors and inverters with gain of 100 and kHz speed. (H. Klauk, U. Zschieschang, J. Pflaum, and M. Halik, "Ultralow-power organic complementary circuits," Nature 445, 745 (2007).) An even higher gain of 500 in a low-voltage inverter resulted from high-mobility (>0.5 cm2/Vs) organic films and high-C $Ta_2O_5$. (S. Tatemichi, M. Ichikawa, S. Kato, T. Koyama, and Y. Taniguchi, "Low-voltage, high-gain, and high-mobility organic complementary inverters based on N,N'-ditridecyl-3,4,9,10-perylenetetracarboxylic diimide and pentacene," Physica Status Solidi-Rapid Research Letters 2, 47 (2008).) $C_{60}$ was an alternative n-material for a gain-100 inverter. (M. Kitamura and Y. Arakawa, "Low-voltage-operating complementary inverters with C-60 and pentacene transistors on glass substrates," Applied Physics Letters 91 (2007).) Variously substituted Perylene tetracarboxylic diimides (PTCDIs) were used with pentacene in inverters. (M. M. Ling, Z. N. Bao, P. Erk, M. Koenemann, and M. Gomez, "Complementary inverter using high mobility air-stable perylene di-imide derivatives," Applied Physics Letters 90 (2007).) A new cyano PTCDI used with pentacene gave a flip-flop with 5 kHz clock speed and ca. 20 microsecond delay times. (B. Yoo, A. Madgavkar, B. A. Jones, S, Nadkarni, A. Facclietti, K. Dimmler, M. R. Wasielewski, T. J. Marks, and A. Dodabalapur, "Organic complementary D flip-flops enabled by perylene diimides and pentacene," Ieee Electron Device Letters 27, 737 (2006).) Pentacene on poly(vinyl alcohol) was sufficient for a 1-kHz buffer. (D. W. Park, C. A. Lee, K. D. Jung, B. J. Kim, B. G. Park, H. Shin, and J. D. Lee, "Electrically stable organic thin-film transistors and circuits using organic/inorganic double-layer insulator," Japanese Journal Of Applied Physics Part 1-Regular Papers Brief Communications & Review Papers 46, 2640 (2007).) Other examples of organic or polymer-based circuits include complete active matrix display backplanes, shift registers, sensor networks, and radio frequency transponders. (T. Someya, Y. Kato, T. Sekitani, S. Iba, Y. Noguchi, Y. Murase, H. Kawaguchi, and T. Sakurai, "Conformable, flexible, large-area networks of pressure and thermal sensors with organic transistor active matrixes," Proceedings Of The National Academy Of Sciences Of The United States Of America 102, 12321 (2005); L. S. Zhou, A. Wanga, S. C. Wu, J. Sun, S. Park, and T. N. Jackson, "All-organic active matrix flexible display," Applied Physics Letters 88 (2006); G. H. Gelinck, H. E. A. Huitema, E. Van Veenendaal, E. Cantatore, L. Schrijnemakers, J. Van der Putten, T. C. T. Geuns, M. Beenhakkers, J. B. Giesbers, B. H. Huisman, E. J. Meijer, E. M. Benito, F. J. Touwslager, A. W. Marsman, B. J. E. Van Rens, and D. M. De Leeuw, "Flexible active-matrix displays and shift registers based on solution-processed organic transistors," Nature Materials 3, 106 (2004); P. F. Baude, D. A. Ender, M. A. Haase, T. W. Kelley, D. V. Muyres, and S. D. Theiss, "Pentacene-based radio-frequency identification circuitry," Applied Physics Letters 82, 3964 (2003).)

The majority of organic semiconductors (OSCs) are hole-carrying materials; only a handful of high-quality air-stable n-channel materials have been discovered. Holes are generally more stable than electrons in conjugated organic systems when exposed to the ambient atmosphere. Air-stable n-channel OSCs should also be designed to be robust against environmental quenchers such as oxygen, synthetic residues, and water.

While hundreds of p-organic semiconductors with mobilities useful for plastic electronics have now been reported, there are still considerably fewer n-OSCs. While for some applications, p-OSCs alone would be sufficient, n-OSCs are needed for the more power-efficient complementary transistor circuits, as well as for devices that relay on p-n junctions, such as thermoelectric modules and solar cells. Limitations on possible pi-frameworks for n-OSCs arise because of the generally more limited stability of injected electrons relative to environmental quenchers such as oxygen and synthesis residues in and around organic semiconductors. For thermodynamic stability of the radical anion to oxygen and water, the reduction potential of an n-OSC would need to be more positive than the standard calomel electrode (SCE). (D. M. deLeeuw, M. M. J. Simenon, A. R. Brown, and R. E. F. Einerhand, "Stability of n-type doped conducting polymers and consequences for polymeric microelectronic devices," Synthetic Metals 87, 53 (1997).) At such positive potentials, n-OSCs are of limited use for transistor applications because of the ease of environmental doping that causes high off currents.

Even with respect to water, the stability window of n-OSCs in n-channel organic field effect transistors (OFETs) is more limited than for p-OSCs. (deLeeuw, D. M.; Simenon, M. M. J.; Brown, A. R.; Einerhand, R. E. F. Synthetic Metals 1997, 87, 53-59.) Approaches to increasing stability originally involved fluorination of either the core conjugated groups or side chains. The specific molecule hexadecafluoro copper phthalocyanine (F16-CuPc) (Bao, Z. A.; Lovinger, A. J.; Brown, J. Journal Of The American Chemical Society 1998, 120, 207-208) was made stable to electron transport by the lowering of its lowest unoccupied molecular orbital (LUMO) energy by the fluoro groups on the conjugated system. (Ghosh, A.; Gassman, P. G.; Almlof, J. Journal Of The American Chemical Society 1994, 116, 1932-1940.; Schlettwein, D.; Hesse, K.; Gruhn, N. E.; Lee, P. A.; Nebesny, K. W.; Armstrong, N. R. Journal Of Physical Chemistry B 2001, 105, 4791-4800.) Another class of condensed ring compounds, naphthalenetetracarboxylic diimides (NTCDIs), especially the N,N'-bis(pentadecafluorooctyl) derivative, "F15"), are apparently stabilized to electron transport, with mobility up to 0.1 $cm^2/Vs$, by fluoro substitution on side chains far enough from the conjugated system to have little effect on the orbital energy levels, but close enough to provide protection against chemical quenching. (Kao, C. C.; Lin, P.; Lee, C. C.; Wang, Y. K.; Ho, J. C.; Shen, Y. Y. Applied Physics Letters 2007, 90.; Katz, H. E.; Lovinger, A. J.; Johnson, J.; Kloc, C.; Siegrist, T.; Li, W.; Lin, Y. Y.; Dodabalapur, A. Nature 2000, 404, 478.; Katz, H. E.; Otsuki, J.; Yamazaki, K.; Suka, A.; Takido, T.; Lovinger, A. J.; Raghavachari, K. Chemistry Letters 2003, 32, 508-509.; Hosoi, Y.; Tsunami, D.; Hisao, I.; Furukawa, Y. Chemical Physics Letters 2007, 436, 139-143.; Katz, H. E.; Johnson, J.; Lovinger, A. J.; Li, W. J. J. Am. Chem. Soc. 2000, 122, 7787-7792.) Since then, the majority of high quality n-channel materials have been based on either naphthalene or perylene tetracarboxylic diimides. (Katz, H. E.; Lovinger, A. J.; Johnson, J.; Kloc, C.; Siegrist, T.; Li, W.; Lin, Y. Y.; Dodabalapur, A. Nature 2000, 404, 478.; Chen, H. Z.; Ling, M. M.; Mo, X.; Shi, M. M.; Wang, M.; Bao, Z. Chem. Mater. 2007, 19, 816-824.; Jones, B. A.; Ahrens, M. J.; Yoon, M. H.; Facchetti, A.; Marks, T. J.; Wasielewski, M. R. Angewandte Chemie-International Edition 2004, 43, 6363-6366.; Schmidt, R.; Ling, M. M.; Oh, J. H.; Winkler, M.; Könemann, M.; Bao, Z.; Wiirthner, F. Adv. Mater. 2007, 19, 3692-3695.; Shukla, D.; Nelson, S. F.; Freeman, D. C., US Patent Application US20060237712A1; Shukla, D.; Freeman, D. C.; Nelson, S. F., US Patent Application US20060134823A1; Shukla, D.; Freeman, D. C.; Nelson, S. F.; Carey, J. T.; Ahearn, W. G., US Patent Application US20070116895A1; Shukla, D.; Freeman, D. C.; Nelson, S. F.; Carey, J. T.; Ahearn, W. G., US Patent Application US20070096084A1.) Vacuum sublimation of these materials, usually at elevated substrate temperatures, results in highly crystalline films. Perylene tetracarboxylic diimides (PTCDIs) (Jones, B. A.; Ahrens, M. J.; Yoon, M. H.; Facchetti, A.; Marks, T. J.; Wasielewski, M. R. Angewandte Chemie-International Edition 2004, 43, 6363-6366.; Chen, H. Z.; Shi, M. M.; Aernouts, T.; Wang, M.; Borghs, G.; Heremans, P. Solar Energy Materials And Solar Cells 2005, 87, 521-527.; Tatemichi, S.; Ichikawa, M.; Koyama, T.; Taniguchi, Y. Applied Physics Letters 2006, 89.; Jones, B. A.; Facchetti, A.; Marks, T. J.; Wasielewski, M. R. Chemistry Of Materials 2007, 19, 2703-2705.; Wurthner, F.; Osswald, P.; Schmidt, R.; Kaiser, T. E.; Mansikkamaki, H.; Konemann, M. Organic Letters 2006, 8, 3765-3768.; Ling, M. M.; Eric, P.; Gomez, M.; Koenemann, M.; Locklin, J.; Bao, Z. N. Advanced Materials 2007, 19, 1123-1127) have been stabilized by substitution with cyanos, chloros, fluoros, and pentadecafluoroalkyls. Jones et al. showed that cyanated PTCDI cores with perfluoroalkyl chains gave a maximum mobility of 0.64 $cm^2/Vs$ while Chen et al. achieved air stable mobilities of 0.068 $cm^2/Vs$ for a bis(perfluorophenyl) PTCDI compound. (Chen, H. Z.; Ling, M. M.; Mo, X.; Shi, M. M.; Wang, M.; Bao, Z. Chem. Mater. 2007, 19, 816-824.; Jones, B. A.; Ahrens, M. J.; Yoon, M. H.; Facchetti, A.; Marks, T. J.; Wasielewski, M. R. Angewandte Chemie-International Edition 2004, 43, 6363-6366.) Recently, air stable core-fluorinated PTCDI compounds were reported with a maximum mobility in air of 0.338 $cm^2/Vs$. (Schmidt, R.; Ling, M. M.; Oh, J. H.; Winkler, M.; Könemann, M.; Bao, Z.; Wiirthner, F. Adv. Mater. 2007, 19, 3692-3695.)

Recently, sufficient electron-withdrawing groups and annealing processes have been used with oligothiophenes (Yoon, M. H.; DiBenedetto, S. A.; Facchetti, A.; Marks, T. J. Journal Of The American Chemical Society 2005, 127, 1348-1349.; Letizia, J. A.; Facchetti, A.; Stern, C. L.; Ratner, M. A.; Marks, T. J. Journal Of The American Chemical Society 2005, 127, 13476-13477.; Ie, Y.; Nitani, M.; Ishikawa, M.; Nakayama, K.; Tada, H.; Kaneda, T.; Aso, Y. Organic Letters 2007, 9, 2115-2118.; Yoon, M. H.; Facchetti, A.; Stern, C. E.; Marks, T. J. Journal Of The American Chemical Society 2006, 128, 5792-5801.; Cai, X. Y.; Burand, M. W.; Newman, C. R.; da Silva, D. A.; Pappenfus, T. M.; Bader, M. M.; Bredas, J. L.; Maim, K. R.; Frisbie, C. D. Journal Of Physical Chemistry B 2006, 110, 14590-14597) (perfluoroacyls, perfluorophenyls, polycyanovinyls, difluoromethylenes), aza heterocycles (Mamada, M.; Nishida, J.; Kumaki, D.; Tokito, S.; Yamashita, Y. Chemistry of Materials 2007, 19, 5404-5409.; Ando, S.; Murakami, R.; Nishida, J.; Tada, H.; Inoue, Y.; Tokito, S.; Yamashita, Y. Journal Of The American Chemical Society 2005, 127, 14996-14997.; Kojima, T.; Nishida, J.; Tokito, S.; Yamashita, Y. Chemistry Letters 2007, 36, 1198-1199.; Naraso; Nishida, J.; Kumaki, D.; Tokitp, S.; Yamashita, Y. Journal Of The American Chemical Society 2006, 128, 9598-9599) and a terthienoquinoid (Handa, S.; Miyazaki, E.; Takimiya, K.; Kunugi, Y. J. Am. Chem. Soc. 2007, 129, 11684-11685) to allow high-mobility, low-threshold voltage (Vt) performance in vacuum and in some cases in air (Jones, B. A.; Ahrens, M. J.; Yoon, M. H.; Facchetti, A.; Marks, T. J.; Wasielewski, M. R. Angewandte Chemie-International Edition 2004, 43, 6363-6366).

Approaches utilizing carbonyl functionalized quaterthiophenes and anthracenedicarboximides have yielded maximum mobilities of 0.34 $cm^2/Vs$ in vacuum for the former and 0.02 $cm^2/Vs$ in air for the latter. (Yoon, M. H.; DiBenedetto, S. A.; Russell, M. T.; Facchetti, A.; Marks, T. J. Chem. Mater. 2007, 19, 4864-4881.; Wang, Z.; Kim, C.; Facchetti, A.; Marks, T. J. J. Am. Chem. Soc. 2007, 129, 13362-13363.) Promising results have also been obtained with the impressively synthesized perfluoropentacene (Inoue, Y.; Sakamoto, Y.; Suzuki, T.; Kobayashi, M.; Gao, Y.; Tokito, S. Japanese Journal Of Applied Physics Part 1-Regular Papers Short Notes & Review Papers 2005, 44, 3663-

3668), aza-acenes (Nishida, J.; Naraso; Murai, S.; Fujiwara, E.; Tada, H.; Tomura, M.; Yamashita, Y. Organic Letters 2004, 6, 2007-2010), and a ladder polymer (Babel, A.; Jenekhe, S. A. Journal of the American Chemical Society 2003, 125, 13656-13657). Nanowire, co-oligomer, and liquid crystal assembly of perylenediimides have also been useful. (Briseno, A. L.; Mannsfeld, S. C. B.; Reese, C.; Hancock, J. M.; Xiong, Y.; Jenekhe, S. A.; Bao, Z.; Xia, Y. Nano Letters 2007, 7, 2847-2853.; Zhan, X. W.; Tan, Z. A.; Domercq, B.; An, Z. S.; Zhang, X.; Barlow, S.; Li, Y. F.; Zhu, D. B.; Kippelen, B.; Marder, S. R. Journal Of The American Chemical Society 2007, 129, 7246-+.; Singh, T. B.; Erten, S.; Gunes, S.; Zafer, C.; Turkmen, G.; Kuban, B.; Teoman, Y.; Sariciftci, N. S.; Icli, S. Organic Electronics 2006, 7, 480-489.) $C_{60}$ also continues to be of interest. (Zhang, X. H.; Domercq, B.; Kippelen, B. Applied Physics Letters 2007, 91.; Na, J. H.; Kitamura, M.; Arakawa, Y. Appl. Phys. Lett. 2007, 91, 193501.)

Thermally evaporated thin films of various N,N'-disubstituted NTCDIs demonstrated high field effect electron mobilities both in vacuum and in air. (H. E. Katz, J. Johnson, A. J. Lovinger, and W. J. Li, "Naphthalenetetracarboxylic diimide-based n-channel transistor semiconductors: Structural variation and thiol-enhanced gold contacts," Journal Of The American Chemical Society 122, 7787 (2000); H. E. Katz, A. J. Lovinger, J. Johnson, C. Kloc, T. Siegrist, W. Li, Y. Y. Lin, and A. Dodabalapur, "A soluble and air-stable organic semiconductor with high electron mobility," Nature 404, 478 (2000).) These materials exhibited mobilities on the order of $10^{-1}$ cm$^2$/Vs, an orders-of-magnitude improvement over most previous n-channel materials. (J. G. Laquindanum, H. E. Katz, A. Dodabalapur, and A. J. Lovinger, "n-channel organic transistor materials based on naphthalene frameworks," Journal Of The American Chemical Society 118, 11331 (1996).) This is consistent with a favorable two-dimensional crystalline film morphology. More importantly, by incorporating perfluoroalkyl chains at the N,N' positions these high mobilities may be achieved in air. These side chains were far enough from the conjugated core to have little effect on the reduction potentials, which were >0.5 V more negative than SCE. Thus, side chains with cross-sections comparable to those of the NTCDI cores add special kinetic stability to transported electrons. (R. T. Weitz, K. Amsharov, U. Zschieschang, E. B. Villas, D. K. Goswami, M. Burghard, H. Dosch, M. Jansen, K. Kern, and H. Klauk, "Organic n-channel transistors based on core-cyanated perylene carboxylic diimide derivatives," Journal Of The American Chemical Society 130, 4637 (2008).) Even a single $CF_3$ group on a small side chain such as benzyl greatly increased air stability (H. E. Katz, J. Johnson, A. J. Lovinger, and W. J. Li, "Naphthalenetetracarboxylic diimide-based n-channel transistor semiconductors: Structural variation and thiol-enhanced gold contacts," Journal Of The American Chemical Society 122, 7787 (2000); H. E. Katz, A. J. Lovinger, J. Johnson, C. Kloc, T. Siegrist, W. Li, Y. Y. Lin, and A. Dodabalapur, "A soluble and air-stable organic semiconductor with high electron mobility," Nature 404, 478 (2000)); C. C. Kao, P. Lin, C. C. Lee, Y. K. Wang, J. C. Ho, and Y. Y. Shen, "High-performance bottom-contact devices based on an air-stable n-type organic semiconductor N,N-bis (4-trifluoromethoxybenzyl)-1,4,5,8-naphthalene-tetracarboxylic di-imide," Applied Physics Letters 90 (2007); Y. L. Lee, H. L. Hsu, S. Y. Chen, and T. R. Yew, "Solution-processed naphthalene diimide derivatives as n-type semiconductor materials," Journal Of Physical Chemistry C 112, 1694 (2008); Y. Hosoi, D. Tsunami, I. Hisao, and Y. Furukawa, "Air-stable n-channel organic field-effect transistors based on N,N'-bis (4-trifluoromethylbenzyl)perylene-3,4,9,10-tetracarboxylic diimide," Chemical Physics Letters 436, 139 (2007).) More recently, other researchers have demonstrated high mobilities from other large-cross-section side chains, such as cyclohexyl (D. Shukla, D. C. Freeman, S. F. Nelson, J. T. Carey, and W. G. Aheam, in United States Patent and Trademark Office, United States, (2007)), substitution of the NTCDI core with electron-withdrawing groups to increase thermodynamic stability of radical anions (B. A. Jones, A. Facchetti, T. J. Marks, and M. R. Wasielewski, "Cyanonaphthalene diimide semiconductors for air-stable, flexible, and optically transparent n-channel field-effect transistors," Chemistry Of Materials 19, 2703 (2007); C. Thalacker, C. Roger, and F. Wurthner, "Synthesis and optical and redox properties of core-substituted naphthalene diimide dyes," Journal Of Organic Chemistry 71, 8098 (2006); C. Roger and F. Wurthner, "Core-tetrasubstituted naphthalene diimides: Synthesis, optical properties, and redox characteristics," Journal Of Organic Chemistry 72, 8070 (2007)), and use of extended diimides such as PTCDIs. (C. Thalacker, C. Roger, and F. Wurthner, "Synthesis and optical and redox properties of core-substituted naphthalene diimide dyes," Journal Of Organic Chemistry 71, 8098 (2006); H. Z. Chen, M. M. Ling, X. Mo, M. M. Shi, M. Wang, and Z. Bao, "Air stable n-channel organic semiconductors for thin film transistors based on fluorinated derivatives of perylene diimides," Chemistry Of Materials 19, 816 (2007); R. Schmidt, M. M. Ling, J. H. Oh, M. Winkler, M. Konemann, Z. N. Bao, and F. Wurthner, "Core-fluorinated perylene bisimide dyes: Air stable n-channel organic semiconductors for thin film transistors with exceptionally high on-to-off current ratios," Advanced Materials 19, 3692 (2007); T. B. Singh, S. Erten, S. Gunes, C. Zafer, G. Turkmen, B. Kuban, Y. Teoman, N. S. Sariciftci, and S. Icli, "Soluble derivatives of perylene and naphthalene diimide for n-channel organic field-effect transistors," Organic Electronics 7, 480 (2006); M. M. Ling, P. Erk, M. Gomez, M. Koenemann, J. Locklin, and Z. N. Bao, "Air-stable n-channel organic semiconductors based on perylene diimide derivatives without strong electron withdrawing groups," Advanced Materials 19, 1123 (2007); J. H. Oh, S. Liu, Z. Bao, R. Schmidt, and F. Wurthner, "Air-stable n-channel organic thin-film transistors with high field-effect mobility based on N,N'-bis(heptafluorobutyl)3,4: 9,10-perylene diimide," Applied Physics Letters 91 (2007); P. R. L. Malenfant, C. D. Dimitrakopoulos, J. D. Gelatine, L. L. Kosbar, T. O. Graham, A. Curioni, and W. Andreoni, "N-type organic thin-film transistor with high field-effect mobility based on a N,N-'-dialkyl-3,4,9,10-perylene tetracarboxylic diimide derivative," Applied Physics Letters 80, 2517 (2002); S. Tatemichi, M. Ichikawa, T. Koyama, and Y. Taniguchi, "High mobility n-type thin-film transistors based on N,N'-ditridecyl perylene diimide with thermal treatments," Applied Physics Letters 89 (2006); R. J. Chesterfield, J. C. McKeen, C. R. Newman, P. C. Ewbank, D. A. da Silva, J. L. Bredas, L. L. Miller, K. R. Mann, and C. D. Frisbie, "Organic thin film transistors based on N-alkyl perylene diimides: Charge transport kinetics as a function of gate voltage and temperature," Journal Of Physical Chemistry B 108, 19281 (2004)), anthracenedicarboximides (Z. Wang, C Kim, A. Facchetti, and T. J. Marks, "Anthracenedicarboximides as air-stable n-channel semiconductors for thin-film transistors with remarkable current on-off ratios," Journal Of The American Chemical Society 129, 13362 (2007); H. E. Katz, W. Li, and A. J. Lovinger, edited by U.S. P. a. T. Office, United States, 2001)) and higher rylenes (F. Nolde, W. Pisula, S. Muller, C. Kohl, and K. Mullen, "Synthesis and self-organization of core-extended perylene tetracarboxdiimides with branched alkyl substituents," Chemistry Of Materials 18, 3715 (2006)).

A series of PTCDIs with small substituents such as core-chloro and -fluoro, and N-heptafluorobutyl and -phenethyl, showed mobilities of 0.1-0.7 cm²/Vs, with some retaining most of the mobility in air. (R. Schmidt, M. M. Ling, J. H. Oh, M. Winkler, M. Konemann, Z. N. Bao, and F. Wurthner, "Core-fluorinated rerylene bisimide dyes: Air stable n-channel organic semiconductors for thin film transistors with exceptionally high on-to-off current ratios," Advanced Materials 19, 3692 (2007); M. M. Ling, P. Erk, M. Gomez, M. Koenemann, J. Locklin, and Z. N. Bao, "Air-stable n-channel organic semiconductors based on perylene diimide derivatives without strong electron withdrawing groups," Advanced Materials 19, 1123 (2007); J. H. Oh, S. Liu, Z. Bao, R. Schmidt, and F. Wurthner, "Air-stable n-channel organic thin-film transistors with high field-effect mobility based on N,N'-bis(heptafluorobutyl)3,4: 9,10-perylene diimide," Applied Physics Letters 91 (2007).) PTCDIs may be attached to polystyrene-acrylate diblocks, with mobility around 0.001 cm²/Vs. (S. Huttner, M. Sommer, and M. Thelakkat, "n-type organic field effect transistors from perylene bisimide block copolymers and homopolymers," Applied Physics Letters 92 (2008).) In an embodiment, an electron-transporting polymer with mobility ca. 0.01 cm²/Vs was made by copolymerizing a PTCDI with dithienothiophene (X. W. Zhan, Z. A. Tan, B. Domercq, Z. S. An, X. Zhang, S. Barlow, Y. F. Li, D. B. Zhu, B. Kippelen, and S. R. Marder, "A high-mobility electron-transport polymer with broad absorption and its use in field-effect transistors and all-polymer solar cells," Journal Of The American Chemical Society 129, 7246 (2007)). While some in-vacuum mobilities exceed 1 cm²/Vs, published mobilities in air are limited to about 0.6 cm²/Vs, and require multistep syntheses, awkward purification, and/or high temperature deposition. The most electron-demanding of these diimides are difficult to drive to fully insulating states.

In addition, solution-processed field effect transistor (FET) semiconductors are now of interest because of their potential contribution to low-cost fabrication of device arrays and circuits via mass manufacturing roll-to-roll processes using a combination of conventional coating and printing techniques. (H. Sirringhaus, Adv. Mater. 2005, 17, 2411-2425.; C. D. Dimitrakopoulos, P. R. L Malenfant, Adv. Mater. 2002, 14, 99-117.; T. Shimoda, Y. Matsuki, M. Furusawa, T. Aoki, I. Yudasaka, H. Tanaka, H. Iwasawa, D. Wang, M. Miyasaka, Y. Takeuchi, Nature 2006, 440, 784-786.; D. B. Mitzi, L. L. Kosbar, C. E. Murray, M. Copel, A. Afzali, Nature 2004, 428, 299-303.; H. E. Katz, A. J. Lovinger, J. Johnson, C. Kloc, T. Siegrist, W. Li, Y. Y. Lin and A. Dodabalapur, Nature 2000, 404, 478-481.). However, existing solution-processed FETs lack sufficiently high electron mobility.

SUMMARY

An electronic or electro-optic device according to some embodiments of the current invention has a first electrode, a second electrode spaced apart from the first electrode, and a layer of hybrid semiconducting-dielectric material disposed between the first and second electrodes. The hybrid semiconducting-dielectric material comprises molecules that have a core section that provides an n-type semiconducting property and side chains that provide a dielectric property to the layer of hybrid semiconducting-dielectric material.

Another aspect of the present invention relates to tetracarboxylic diimide compounds having the following structure:

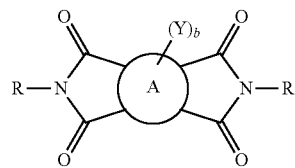

wherein A is a condensed aromatic moiety having 2-6 fused aromatic rings or heterocyclic variants thereof. Y is a substituent, and b is an integer from 0 to the number of unsubstituted carbon atoms on aromatic moiety A. R is a fluorine substituted aliphatic or aromatic moiety linked to the tetra-carboxylic diimide structure by an alkylene or heteroalkylene linking group.

In certain embodiments, R is one of structures II, III or IV, shown below:

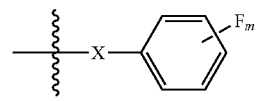

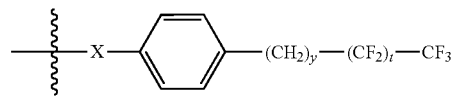

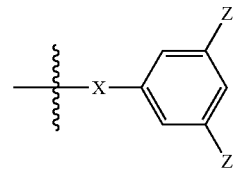

wherein X is $-(CH_2)_v-$, $-(CH_2)_w-O-$, or $-(CH_2)_w-O-(CH_2)_v-$, Z is an electron withdrawing substituent, v is independently 1, 2, 3, or 4, and w is independently 2, 3, or 4, m is an integer from 1 to 5, with the proviso that when A forms a perylene tetracarboxylic diimide, m is 3, 4, or 5, y is each independently 0, 1, 2, 3, or 4, and t is an integer from 1 to 20.

BRIEF DESCRIPTION OF THE DRAWINGS

Additional features of this invention are provided in the following detailed description of various embodiments of the invention with reference to the drawings. Furthermore, the above-discussed and other attendant advantages of the present invention will become better understood by reference to the detailed description when taken in conjunction with the accompanying drawings, in which:

FIG. 1 also shows an optional p-type semiconductor layer.

FIG. 9 shows a table for device properties and conditions for OFETs of compound III-1 measured in air.

DETAILED DESCRIPTION OF VARIOUS EMBODIMENTS

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited herein are incorporated by reference as if each had been individually incorporated.

Figure 1:
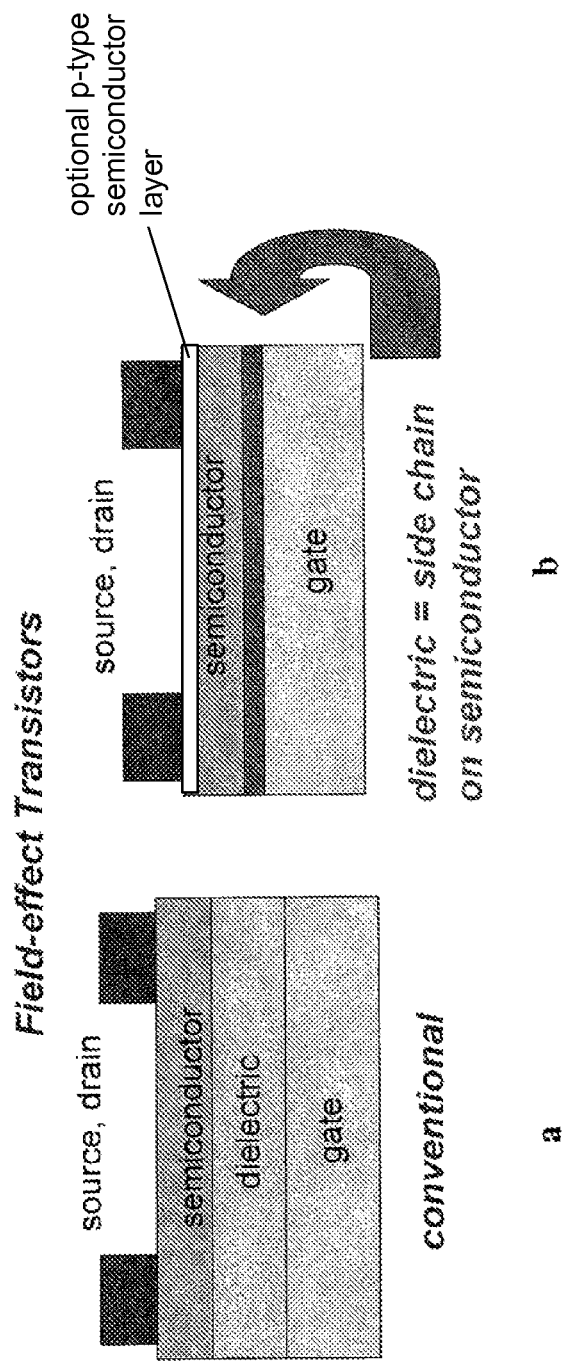
FIG. 1 shows a conventional top-contact transistor structure and an exemplary top-contact transistor structure according to the present invention.

Hybrid semiconducting-dielectric materials comprising side chains that spontaneously form high mobility layers flanked by electrically insulating sheaths may be used as a combination semiconductor-gate dielectric (FIG. 1b). The hybrid semiconducting-dielectric materials may also be used to define film and/or composite structures for various electronic applications. The example of FIG. 1b is just one example of a three-electrode device according to an embodiment of the current invention. However, the current invention is not limited to this specific example and is not limited to only three electrode electronic and/or electro-optic devices. In other embodiments, it can include two-electrode electronic and/or electro-optic devices and/or devices with more that three electrodes. Examples of n-OSCs may be tetracarboxylic diimides (TCDIs), including naphthalenetetracarboxylic diimides (NTCDIs), and/or perylenetetracarboxylic diimides (PTCDIs). TCDI derivatives with such side chains may, for example, enable sub-1 V transistor operation without the need for separate gate dielectric deposition steps, show enhanced mobility because of the improved consistency of the "dielectric-semiconductor interface" relative to separated n-OSCs and dielectrics, show significant dielectric strength because of the density of side chain packing, retain transparency inherent to TCDIs, and/or increase radiation stability of components because there is no bulk dielectric to become ionized.

In some embodiments, TCDIs with specific side chains optimize the semiconductor's electron mobility and the ability of the semiconductors to function without any separate gate dielectrics. Additionally, longer side chains may avoid the need for native oxide layers, and allow printable gate electrodes.

Embodiments of the present invention relate to hybrid semiconducting-dielectric materials, for example, tetracarboxylic diimide compounds having the following structure:

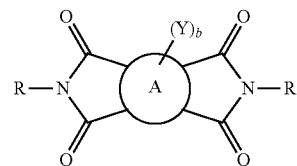

wherein A is a condensed aromatic moiety having 2-6 fused aromatic rings or heterocyclic variants thereof. Y is a substituent, and b is an integer from 0 to the number of unsubstituted carbon atoms on aromatic moiety A. R is a fluorine substituted aliphatic or aromatic moiety linked to the tetracarboxylic diimide structure by an alkylene or heteroalkylene linking group.

In certain embodiments, R is one of structures II, III or IV, shown below:

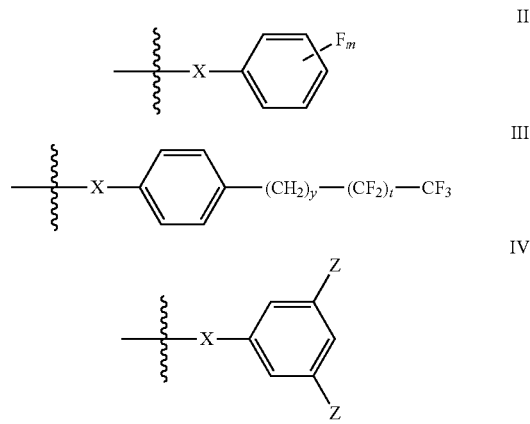

wherein X is —$(CH_2)_v$—, —$(CH_2)_w$—O—, or —$(CH_2)_w$—O—$(CH_2)_v$—, Z is an electron withdrawing substituent, v is independently 1, 2, 3, or 4, and w is independently 2, 3, or 4, m is an integer from 1 to 5, with the proviso that when A forms a perylene tetracarboxylic diimide, m is 3, 4, or 5, y is each independently 0, 1, 2, 3, or 4, and t is an integer from 1 to 20.

A heterocyclic variant of the aromatic moiety is defined as a condensed aromatic structure where one or more aromatic ring is a heteroaromatic ring.

The condensed aromatic moiety may be substituted by Y or may be unsubstituted. The Y substituent on the condensed aromatic moiety may include, for example, alkyl groups, alkenyl groups, alkoxy groups, halogens such as fluorine or chlorine, cyano, aryl, arylalkyl, haloalkyl groups such as trifluoromethyl ($CF_3$) or other groups that do not adversely affect the n-type semiconductor properties of the film made from such compounds. It is advantageous to avoid substituents that tend to interfere with close approach of the conjugated cores of the compounds in a stacked arrangement of the molecules that is conducive to semiconductor properties. Such substituents include highly branched groups, ring structures, and groups having more than 12 atoms, particularly where such groups or rings would be oriented to pose a significant steric barrier to the close approach of the conjugated cores. In addition, substituent groups should be avoided that substantially lower the solubility and/or volatility of the compounds such that the desirable fabrication processes are prevented.

In some embodiments the condensed aromatic moiety is substituted by at least one substituent Y, where Y is fluorine, cyano, or trifluoromethyl. In exemplary embodiments, for example, where b=2, there are 2 Y groups. In these cases each Y may be the same or different.

Substituent Z is an electron withdrawing group that does not otherwise affect the n-type semiconductor properties of the film made from such compounds or otherwise hinder the molecular packing of the compounds in the film. The Z substituent may be, for example, a trifluoromethoxy ($OCF_3$) group or a fluorinated alkyl group of the formula $C_nF_{(2n+1)}$ where n is 1, 2, 3, or 4. The fluorinated alkyl group includes linear or branched groups and may be, for example, trifluoromethyl ($CF_3$), pentafluoroethyl ($C_2F_5$), perfluoropropyl ($CF_2CF_2CF_3$), perfluoroisopropyl ($CF(CF_3)_2$, perfluorobutyl ($CF_2)_3CF_3$) or perfluoroisobutyl ($CF_2CF(CF_3)$).

In some embodiments, A forms a naphthalene 1,4,5,8-tetracarboxylic acid diimide having the following structure:

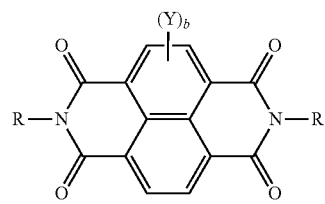

1 where Y and R are defined above. The naphthalene nucleus may be substituted by Y or may be unsubstituted. In this case, b is 0, 1, 2, 3, or 4, according to the number of unsubstituted carbon atoms on the naphthalene nucleus. For example, the naphthalene nucleus may be substituted by at least one fluorine atom, cyano group, or trifluoromethyl group, or may have no substituents other than hydrogen.

In some embodiments, A forms a naphthalene 2,3,6,7-tetracarboxylic acid diimide having the following structure:

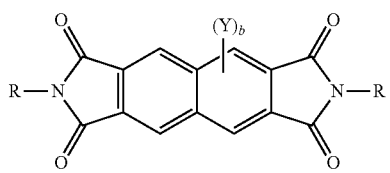

2 where Y and R are defined above. The naphthalene nucleus may be substituted by Y or may be unsubstituted. In this case, b is 0, 1, 2, 3, or 4, according to the number of unsubstituted carbon atoms on the naphthalene nucleus. For example, the naphthalene nucleus may be substituted by at least one fluorine atom, cyano group, or trifluoromethyl group, or may have no substituents other than hydrogen.

In some embodiments, A forms an anthracene 2,3,6,7-tetracarboxylic acid diimide having the following structure:

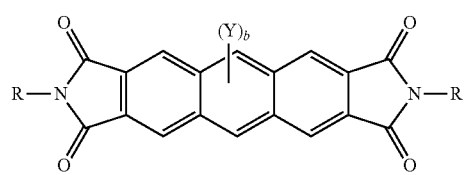

3 where Y and R are defined above. The anthracene nucleus may be substituted by Y or may be unsubstituted. In this case, b is 0, 1, 2, 3, 4, 5 or 6 according to the number of unsubstituted carbon atoms on the anthracene nucleus. For example, the anthracene nucleus may be substituted by at least one fluorine atom, cyano group, or trifluoromethyl group, or may have no substituents other than hydrogen.

In some embodiments, A forms a perylene 3,4,9,10-tetracarboxylic acid diimide having the following structure:

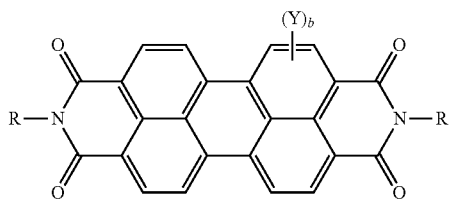

4 where Y and R are defined above. The perylene nucleus may be substituted by Y or may be unsubstituted. In this case, b is 0, 1, 2, 3, 4, 5, 6, 7, or 8 according to the number of unsubstituted carbon atoms on the perylene nucleus. For example, the perylene nucleus may be substituted by at least one fluorine atom, cyano group, or trifluormethyl group, or may have no substituents other than hydrogen.

In view of the present disclosure, persons skilled in the art will recognize additional core structures (A) that can be used for the present invention.

In some embodiments, R has the following structure:

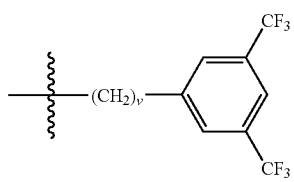

where v is 1 or 2.

In some embodiments, R has the following structure:

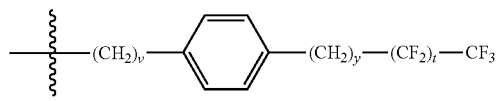

where v is 1 or 2, y is 1 or 2, and t is 5, 6, 7, 8 or 9.

In some embodiments, R has the following structure:

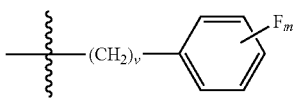

where v is 1 or 2, and m is 1, 2, 3, 4, or 5.

Specific illustrative examples of tetracarboxylic diimide compounds according to the present invention are shown by the following structures:

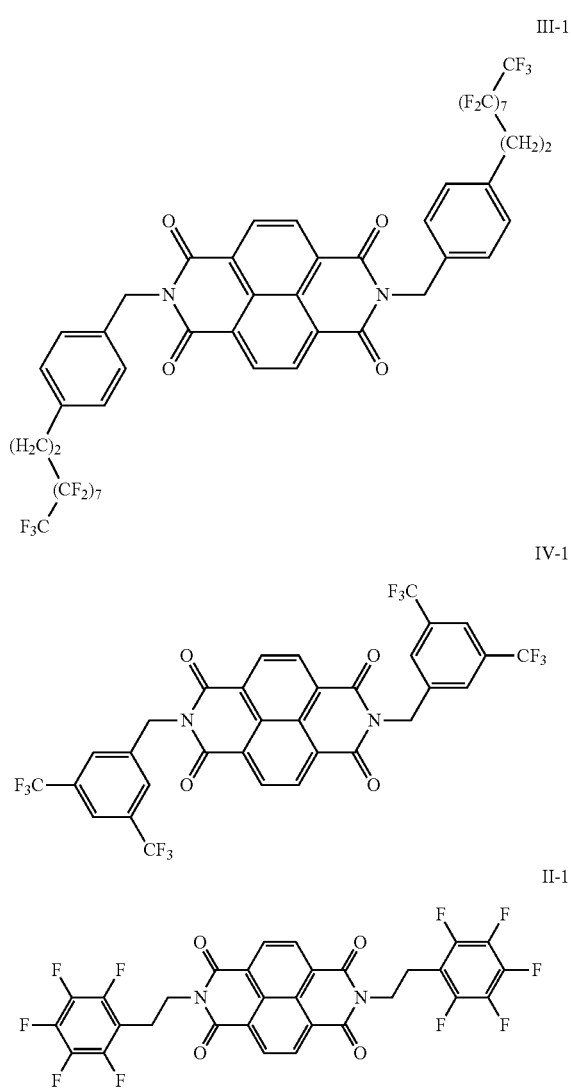

The compounds of the present invention can be conveniently prepared by procedures known in the art. For example, the compounds can be prepared by reaction of the appropriate primary amine with the appropriate tetracarboxylic dianhydride to form the tetracarboxylic diimide.

The compounds of the present invention form semiconductor films, deposited onto a substrate by any suitable method. For example, vapor phase deposition, including rapid sublimation may be used to deposit the compound onto a suitable substrate. Likewise, solvent processing, including dip coating, drop casting, spin coating or blade coating may be used. The semiconducting layer may include one or more layers of the semiconducting material.

Thin films comprising the compounds of the present invention have high electron mobilities in air. Films of the compounds may have electron mobilities in air greater than about 0.01 cm$^2$/Vs, preferably greater than about 0.1 cm$^2$/Vs. Mobilities were calculated from the saturation regime and fitted in the regions of highest slope.

Additionally, thin films comprising the compounds of the present invention have high on/off ratios. Films of the compound may have on/off ratios of at least $10^4$, preferably at least $10^5$ and more preferably at least $10^6$.

Applications of these new materials may include high-speed plastic-based circuits taking advantage of shorter channels available because of the high-capacitance gates, flexible and pressure-sensitive circuits, supercapacitors where redox processes of the cores combined with high dielectric strength will increase energy density, and solar cells where the side chains promote preferred bulk heterojunction morphology. In some embodiments, films of the hybrid semiconducting materials of the present invention are used in thin film transistors, and complementary inverter circuits.

Such TFTs and other devices are useful in electronic devices, including for example, more complex circuits, such as shift registers, integrated circuits, or logic circuits, active matrix displays, and ring oscillators. In certain embodiments, organic/printed active electronics may provide control, amplification, and logic. Exemplary applications may be in circuits of moderate complexity, such as display drivers, radio frequency identification tags, or pressure mapping elements. (T. W. Kelley, P. F. Baude, C. Gerlach, D. E. Ender, D. Muyres, M. A. Haase, D. E. Vogel, and S. D. Theiss, "Recent progress in organic electronics: Materials, devices, and processes," Chemistry Of Materials 16, 4413 (2004); T. Someya, Y. Kato, T. Sekitani, S. Iba, Y. Noguchi, Y. Murase, H. Kawaguchi, and T. Sakurai, "Conformable, flexible, large-area networks of pressure and thermal sensors with organic transistor active matrixes," Proceedings Of The National Academy Of Sciences Of The United States Of America 102, 12321 (2005); R. Parashkov, E. Becker, T. Riedel, H.-H. Johannes, and W. Kowalsky, "Large area electronics using printing methods," Proceedings Of The Ieee 93, 1321 (2005).) Additional exemplary embodiments include complex organic-based circuitry for radiofrequency identification tags, where MHz switching speeds have been demonstrated. (S. Steudel, S. De Vusser, K. Myny, M. Lenes, J. Genoe, and P. Heremans, "Comparison of organic diode structures regarding high-frequency rectification behavior in radio-frequency identification tags," Journal Of Applied Physics 99 (2006); S. Steudel, K. Myny, V. Arkhipov, C. Deibel, S. De Vusser, J. Genoe, and P. Heremans, "50 MHz rectifier based on an organic diode," Nature Materials 4, 597 (2005).) Exemplary embodiments may further include wireless power distribution. (T. Sekitani, M. Takamiya, Y. Noguchi, S, Nakano, Y. Kato, T. Sakurai, and T. Someya, "A large-area wireless power transmission sheet using printed organic transistors and plastic MEMs switches," Nature Materials 6, 413 (2007).)

The compounds of the present invention may be used without a gate dielectric layer between the semiconducting layer and the gate electrode. In this case the side chains of the hybrid semiconducting-dielectric materials provide a built-in dielectric layer, eliminating the need for a separate dielectric layer. In some embodiments, the surface of the electrode may comprise only the native oxide formed by air oxidation, or may be unoxidized. In some embodiments, a self-assembled monolayer (SAM) may be used to treat the electrode surface prior to deposition of the organic semiconductor. In exemplary embodiments, the SAM may be formed by treatment of the electrode surface with a solution of a silane compound to form a silane monolayer. The self-assembled monolayer may be formed, for example, by octadecyltrimethoxysilane or perfluorodecyltrimethoxysilane.

A support may be used for supporting the device during manufacturing, testing, and/or use. The skilled artisan will appreciate that a support selected for commercial embodiments may be different from one selected for testing or screening various embodiments. In some embodiments, the support does not provide any necessary electrical function. This type of support is termed a "non-participating" support. Useful materials can include organic or inorganic materials. For example, the support may comprise inorganic glasses, ceramic foils, polymeric materials, filled polymeric materials, coated metallic foils, acrylics, epoxies, polyamides, polycarbonates, polymimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylenesulfide) (PPS), and fiber-reinforced plastics.

In certain embodiments, a flexible support is used. This allows for roll processing, which may be continuous, providing economy of scale and economy of manufacturing over flat and/or rigid supports, and enables the production of flexible electronic devices. Flexible supports however, require a low substrate temperature for deposition. Advantageously, in embodiments of the present invention, thin films of the hybrid semiconducting-dielectric materials have high electron mobility, and high degree of air stability when deposited at low substrate temperatures (below 100° C.). In certain embodiments, the films are formed with a substrate temperature at room temperature. In other embodiments, the films are deposited at a substrate temperature of 40, 60 or 80° C. At these substrate temperatures, the electron mobility of the deposited films is greater than 0.01 $cm^2/Vs$ preferably greater than about 0.1 $cm^2/Vs$ In some embodiments, the support is optional. For example, when the gate electrode provides sufficient support for the intended use of the resultant OTFT, the support is not required. In addition, the support may be combined with a temporary support. In such an embodiment, one support may be detachably adhered or mechanically affixed to another support such as when one support is desired for a temporary purpose, e.g. manufacturing, transport, testing, and/or storage. For example, a flexible polymeric support may be adhered to a rigid glass support, which could be removed.

The gate electrode can be any useful conductive material. A variety of gate materials known in the art are also suitable, including metals, degerately doped semiconductors, conducting polymers, and printable materials such as carbon ink or silver-epoxy. For example, the gate electrode may comprise doped silicon, or a metal, such as aluminum, chromium, gold, silver, nickel, palladium, platinum, tantalum and titanium. Conductive polymers can also be used, for example polyaniline, poly(3,4-ethylenedioxythiophene/poly(styrene sulfonate) (PEDOT:PSS). In addition, alloys, combinations and multilayers of these materials may be useful.

While the hybrid organic semiconductors of the present invention may advantageously be used without a separate dielectric layer, in certain embodiments the hybrid organic semiconducting compounds may be used in conjunction with a separate dielectric layer. (The term "separate" here means that it is formed from separate molecules that are not merely portions of the hybrid semiconductor-dielectric molecules.) In some embodiments the gate dielectric may be formed by oxidizing the gate electrode material to form the gate dielectric, or may be formed by deposition of a separate dielectric layer. The dielectric layer may be formed of any suitable material. The dielectric constant of the dielectric layer can vary widely depending on the particular device and circumstance of use. Useful materials for the gate dielectric may comprise, for example, an inorganic electrically insulating material, such as strontiates, tantalates, titanates, zirconates, aluminum oxides, silicon nitrides, barium titanate, barium strontium titanate, barium zirconate titanate, zinc seleinde, or zinc sulfide. The gate dielectric may comprise a polymeric material, such as polyvinylidenedifluoride (PVDF), cyanocelluloses, polyimides, etc. Alloys, combinations, mixtures and multilayers may also be used for the dielectric layer.

In certain embodiments, a separate dielectric layer can be a material that has electrically non-conducting planar structures with intercalated ions therebetween. The intercalated ions can be free to move in two dimensions between the electrically non-conducting planes, while being impeded from moving to the electrodes by the electrically non-conducting planes. In operation, the ions of the separate dielectric material can be polarized by an applied voltage. The dielectric layer may be, for example, sodium beta-alumina (Na-$\beta Al_2O_3$) or sodium beta-double-prime alumina in some embodiments. However, the dielectric layer is not limited to only these particular examples.

The source electrode and drain electrode are separated from the gate electrode by the hybrid organic semiconductor-dielectric material. In other embodiments, there can be additional dielectric layers and/or additional layers of other materials between the drain and source electrodes. In some embodiments, there can be multiple layers of semiconductor materials between the source and drain electrodes and the gate electrode. For example, there can be a p-type semiconductor layer in addition to an n-OSC layer to provide devices with a p-n junction according to some embodiments of the current invention. The n-type and p-type semiconducting layers can be arranged with one on top of the other or side-by-side in some embodiments of the current invention. The source and drain electrodes can be any useful conductive material, including most of those materials described above for the gate electrode, for example, aluminum, barium, calcium, chromium, gold, silver, nickel, palladium, platinum, titanium, polyaniline, PEDOT:PSS, other conducting polymers, alloys thereof and multilayers thereof.

The thin film electrodes (e.g. gate electrode, source, electrode, and drain electrode) can be provided by any useful means such as physical vapor deposition (e.g. thermal evaporation or sputtering) or ink jet printing. The patterning of those electrodes can be accomplished by known methods such as shadow masking, additive photolithography, subtractive photolithography, printing, microcontact printing, and pattern coating.

EXAMPLES

A. Synthesis Procedure

Exemplary fluorinated NTCDIs were synthesized as reported previously by reacting fluorinated primary amines with naphthalene tetracarboxylic dianhydride in quinoline with zinc acetate as the catalyst, according to the scheme below. (Katz et al., Nature, vol. 404, p. 478, 2000). Crude solid was then purified one or two times by vacuum sublimation, and analyzed by elemental analysis.

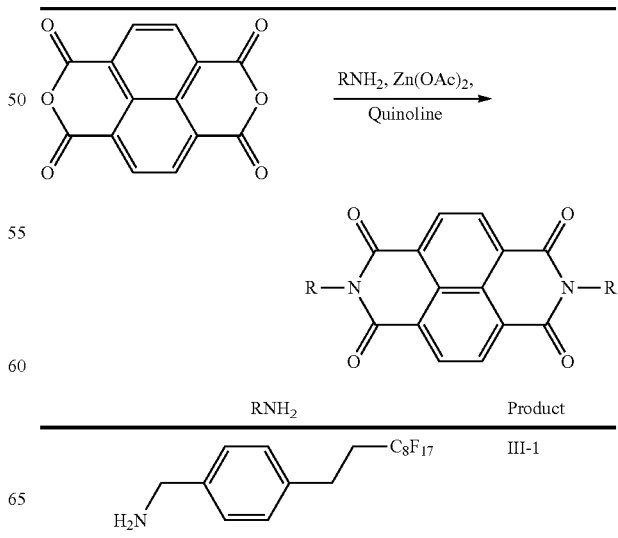

-continued

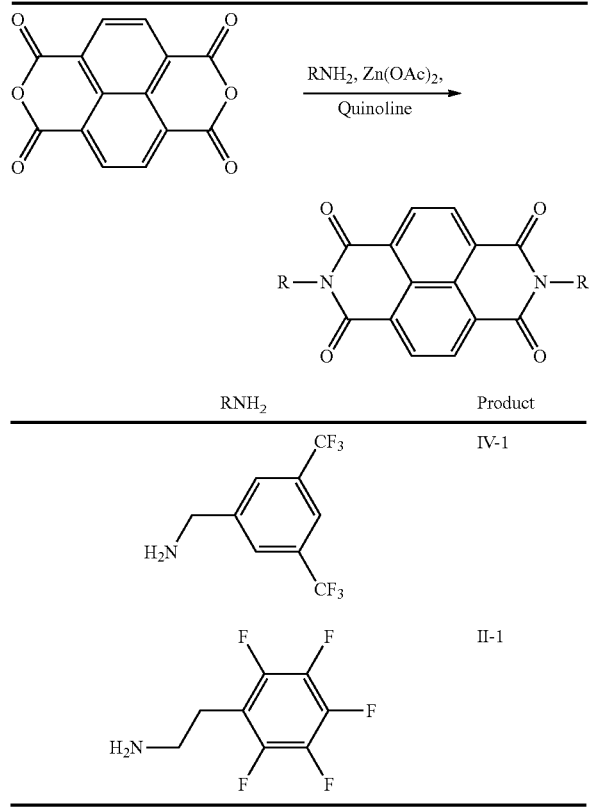

Example 1

Compound III-1 was prepared according to the above method. Elemental analysis (calcd: C, 43.07; F, 48.25; H, 1.81; N, 2.09. found: C, 43.32; F, 47.3; H, 2.14; N, 2.23.) showed a high level of purity of the sublimed compound.

Example 2

Compound IV-1 was prepared according to the above method. Elemental analysis (calcd: C, 53.50; F, 31.73; H, 1.96; N, 3.90. found: C, 54.05; F, 32.2; H, 1.79; N, 3.91.) showed a high level of purity of the sublimed compound.

Example 3

Compound II-1 was prepared according to the above method. Elemental analysis (calcd: C, 55.06; H, 1.85; N, 4.28. found: C, 55.1; H, 1.79; N, 4.45.) showed a high level of purity of the sublimed compound.

B. Crystal Structure

Example 4

Figure 2:
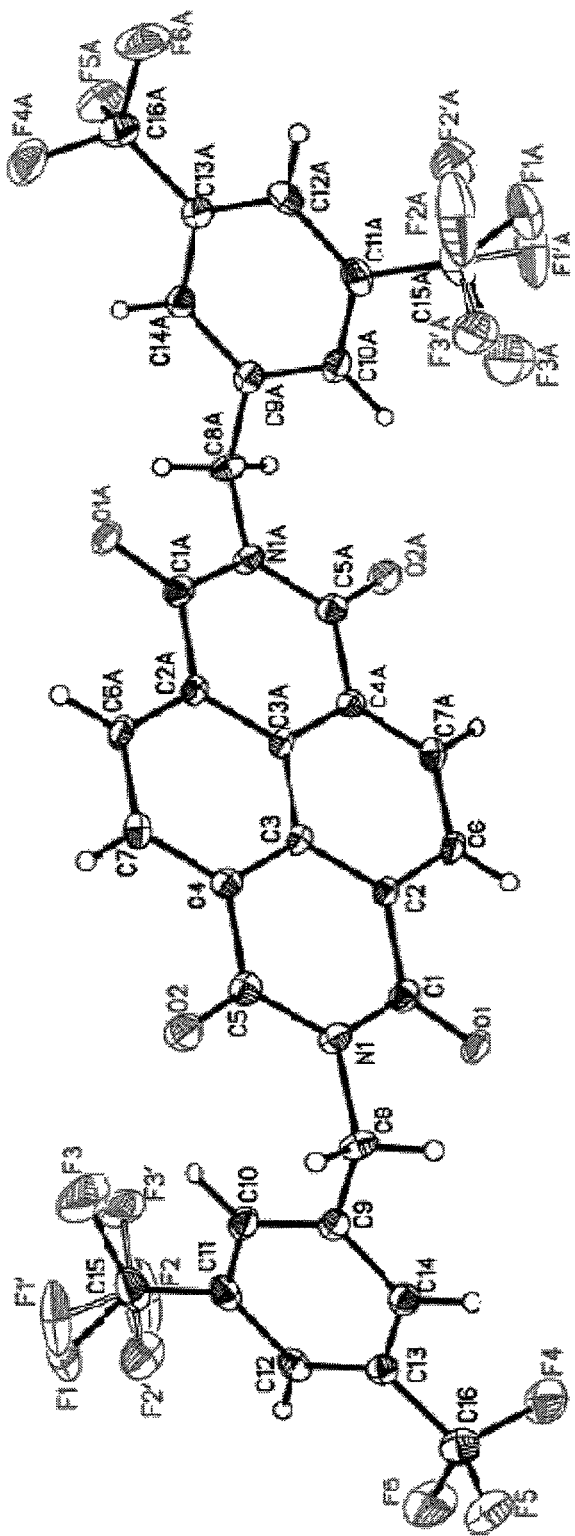
FIG. 2 shows the single crystal-derived molecular structure of compound IV-1.

Using Nitrogen carrier gas, crystals of compound IV-1 were successfully grown and analyzed. FIG. 2 shows the molecular structure of compound IV-1 determined by single crystal XRD.

Figure 3:
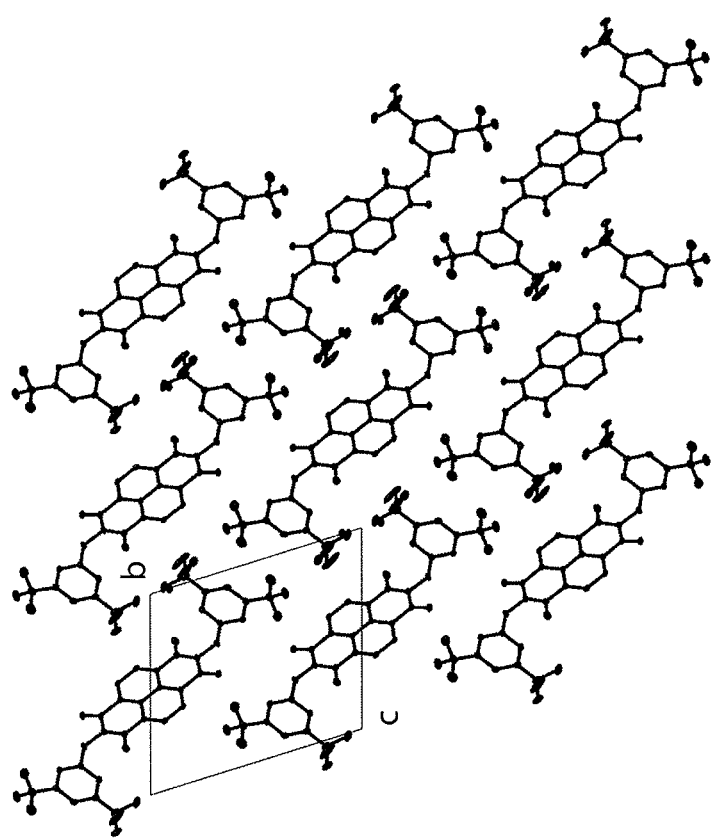
FIG. 3 shows crystallographic layers of compound IV-1 from X-ray diffraction. Further layers are pi-stacked with cores in registry.

FIG. 3 shows the packing in the crystal of compound IV-1, which differs from that of previously reported compounds with similar molecular structures. (Katz, H. E.; Siegrist, T.; Schön, J. H.; Kloc, C.; Batlogg, B.; Lovinger, A. J.; Johnson, J. ChemPhysChem 2001, 2, 167-172.) In the majority of reported NTCDI derivative crystal structures, some variation of herringbone packing is present, i.e. the structure is dominated by an edge to face interaction. In the case of IV-1, the NTCDI cores are oriented parallel to each other, stacking along the a axis (b and c indicate the other two axes). In the case with a single trifluoromethyl group at the 4 position of the benzyl group, packing occurs in a herringbone fashion (Katz, H. E.; Siegrist, T.; Schön, J. H.; Kloc, C.; Batlogg, B.; Lovinger, A. J.; Johnson, J. ChemPhysChem 2001, 2, 167-172.), whereas in this case with the trifluoromethyl groups at the 3 and 5 positions, there is parallel pi-stacking. It appears that this slight change in structure induces considerably different packing motifs for the two molecules.

C. Device Fabrication

The example devices were fabricated by thermal evaporation of organic films onto heavily doped oxidized silicon wafers which served as gate and gate dielectric. Oxide thicknesses were ca. 320 nm and values used for calculations were average thicknesses obtained by ellipsometry. Depositions took place under vacuum at pressures of $2-6\times10^{-6}$ mbar. In order to optimize device properties, films were deposited onto oxide surfaces with solution-deposited silane monolayers. Compounds for self-assembled monolayer surface treatments, octadecyltrimethoxysilane (O-SAM) (Aldrich) and perfluorodecyltrimethoxysilane (F-SAM) (Synquest Labs), were used as received. Surface treatments consisted of sonication of oxidized wafers in isopropanol followed by drying in a vacuum oven. Then substrates were cleaned in an oxygen plasma for 5 to 10 minutes and then placed immediately in a glass Petri dish with a 1 percent solution of silane in toluene. The dishes were then placed on a hot plate and heated from room temperature to 80° C. and held for 5 minutes while covered with a watch glass. Substrates were removed and immediately rinsed with fresh toluene and then placed in a bath of toluene for another 2-minute sonication. Wafers were removed and dried with nitrogen, then placed on a hot plate at 150° C. to cure for at least 1 hour. Devices without monolayers were fabricated directly onto the wafer after sonication and vacuum oven drying. All devices were in the top contact configuration, with gold electrodes thermally evaporated after organic deposition to thicknesses of approximately 50 nm.

D. Thin Film Morphology

Example 5

Figure 4:
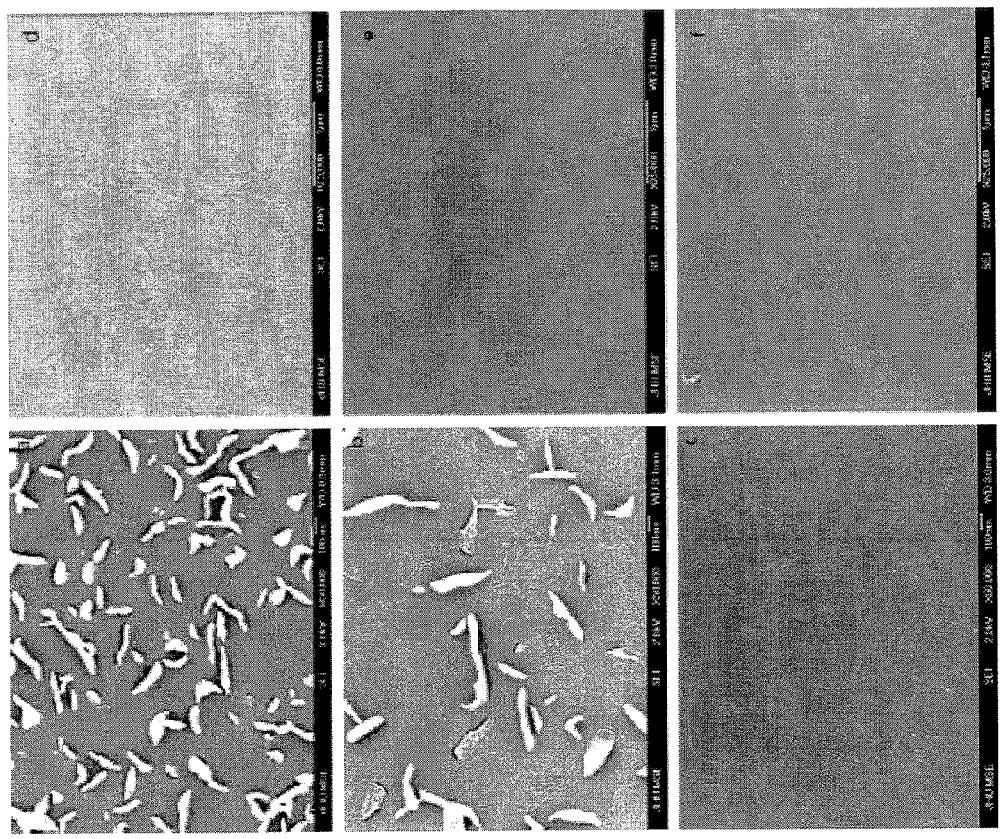
FIG. 4 shows SEM images for thin films of compound III-1.

FIG. 4 illustrates SEM images for thin films of III-1 deposited on O-SAM treated substrates at a) 100° C. b) 120° C. and c) 140° C. at 50K magnification and for III-1 deposited at 140° C. on d) untreated substrate e) O-SAM treated substrate and f) F-SAM treated substrate at 25K magnification. As with most organic semiconductors, thin film growth of compound III-1 is very sensitive to substrate temperature at the time of deposition, shown in FIG. 4(a-c). The film morphology does not resemble closely packed individual grains but rather terraced plate-like regions of overlapping grains. While defining a grain size is difficult, it is clear that continuous regions of material increase in extent as the substrate temperature is increased. Additionally, the terracing is noticeably decreased as the temperature increased, leading to more uniform surfaces.

Another feature of film growth is the appearance of protruding grains that appear to grow out of the plane of the film (bright features in FIG. 4(a,b). As the substrate temperature $T_S$ increases, the density of these protruding grains decreases and at $T_S=140°$ C. they are very sparse and large regions free of these "bulging" grains can be found. One possible explanation is that the increased thermal energy allows for enhanced surface diffusion of the molecules, leading to a decrease in extended grains while also creating larger crystalline domains in the lateral direction. Silane surface treatments also affected the observed film morphology, though with a less dramatic effect compared to substrate temperature, shown in FIG. 4(e-f). Films deposited on the untreated substrate gives a more terraced surface with smaller crystalline domains compared to films deposited on the SAM functionalized substrates. Later, the possible contribution of these phenomena will be discussed in the context of the device data.

E. Thin Film Crystallinity

X-ray diffraction scans were acquired in the Bragg-Brentano (θ-2θ) geometry using a Phillips X-pert Pro X-ray diffraction system. Scan parameters were: step size 0.02° a time per step of 4 seconds. Theoretical molecular lengths used for comparison were measured using the Spartan '04 software.

Example 6

Figure 5:
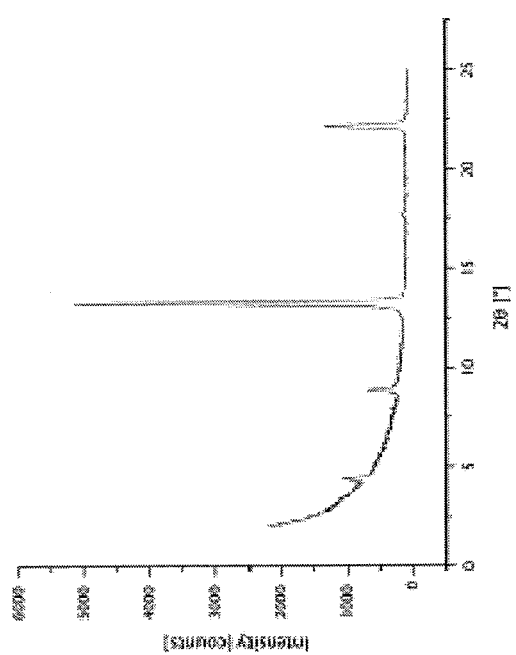
FIG. 5 shows X-ray diffraction pattern of compound IV-1 deposited on an untreated surface.

X-ray diffraction patterns of compound III-1 and compound IV-1 show strong ordering with sharp diffraction peaks. FIG. 5 shows the diffraction pattern for compound IV-1 deposited on an untreated substrate. Extracting the d-spacing from the first order peak (~4.39°) gives a layer spacing of approximately 2 nm, which matches the theoretical length of a molecule of IV-1, indicating that the molecules orient nearly perpendicular to the substrate. The diffraction pattern shows peaks corresponding to the 2nd through 5th order peaks of that layer spacing.

Example 7

Figure 6:
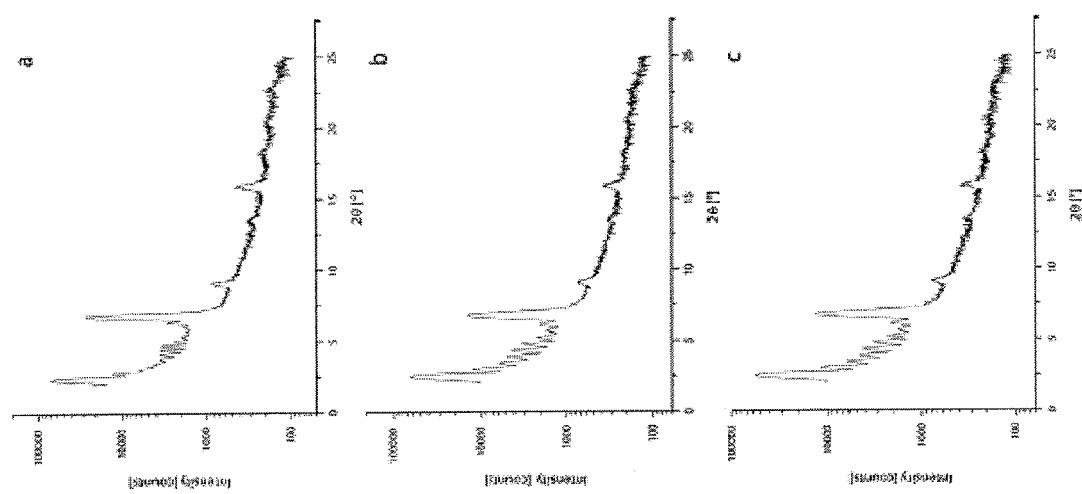
FIG. 6 shows X-ray diffraction patterns for compound III-1.

FIG. 6 shows the diffraction pattern for thin films of compound III-1 deposited on the three different substrates (untreated, O-SAM, and F-SAM) at 140 C. These samples were made during the same depositions as the devices shown in FIG. 8. The film deposited on an untreated substrate gives an extracted layer spacing of 3.7 nm, which is somewhat smaller than the predicted 4.2 nm. This means the molecules may be inclined at a slight angle relative to substrate and also may not pack with a fully planar conformation as is assumed in the theoretical length calculation. It is important to keep in mind that for the laboratory x-ray source at such low angles, the peak position can be very sensitive to sample positioning so that making precise claims about layer spacing carries some experimental uncertainty.

Higher order peaks due to the layer thickness are also present, however, the 2nd and 5th order peaks appear to be missing. One feature of interest is the appearance of a series of small peaks on the shoulder of the first order layer spacing. These oscillations are due to interference of waves reflected from the top and bottom of the film, commonly referred to as Kiessig fringes. (Als-Nielsen, J.; McMorrow, D. Elements of Modern X-Ray Physics; Wiley.) These fringes only occur in the case of very smooth films and are not common in standard θ-2θ scans of organic films, however they are more often observed with high resolution synchrotron sources. (Als-Nielsen, J.; McMorrow, D. Elements of Modern X-Ray Physics; Wiley.; Dun, A. C.; Schreiber, F.; Munch, M.; Karl, N.; Krause, B.; Kruppa, V.; Dosch, H. Appl. Phys. Lett. 2002, 81, 2276.) The appearance of Kiessig fringes using a standard laboratory x-ray source indicates particularly well ordered surfaces compared to other organic materials. The smooth surface of the film is best exemplified by the image in FIG. 4(c), where there is little terracing and mostly large flat grains. Additionally, the appearance of these oscillations indicates that there is excellent ordering at the organic/dielectric interface which partially explains the superior device performance for these films. This property could potentially be exploited in ambipolar transistor applications where sharp interfaces are presumed to improve behavior. (Shi, J. W.; Wang, H.; Song, D.; Tian, H.; Geng, Y.; Yan, D. Adv. Funct. Mater. 2007, 17, 397-400.)

F. Device Characterization

Devices were measured using an Agilent 4155C Semiconductor Parameter Analyzer using ICS lite software. Measurements were conducted in a closed chamber under constant dry air flow. Multiple devices were tested for each substrated temperature and treatment as recorded in FIG. 9. Devices with gate leakage exceeding 100 nA were excluded. The channel widths were ca. 2 mm and lengths ranged from 180 to 250 µm. Mobilities were calculated from the saturation regime and fitted in the regions of highest slope. (Horowitz, G; Hajlaoui, M. E.; Hajlaoui, R., J. Appl. Phys. 2000, 87, 4456-4463)

Example 8

Figure 7:
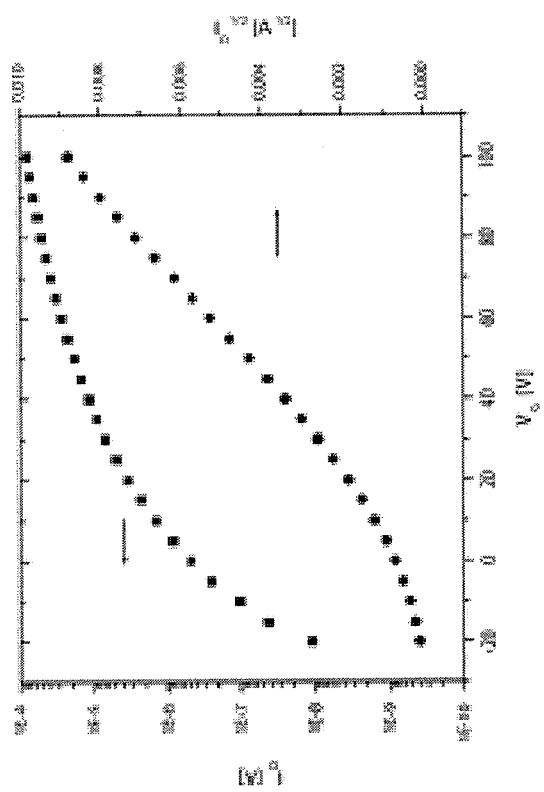
FIG. 7 shows the transfer characteristics for compound IV-1 deposited on an untreated substrate.

A device was fabricated according to the procedure described above, using exemplary compound IV-1 deposited at 100° C. on an untreated wafer. FIG. 7 shows the transfer characteristics for a representative device from IV-1 deposited at 100° C. on an untreated wafer. This device gave a field effect mobility of 0.10 cm$^2$/Vs measured in room air.

Example 9

Figure 8:
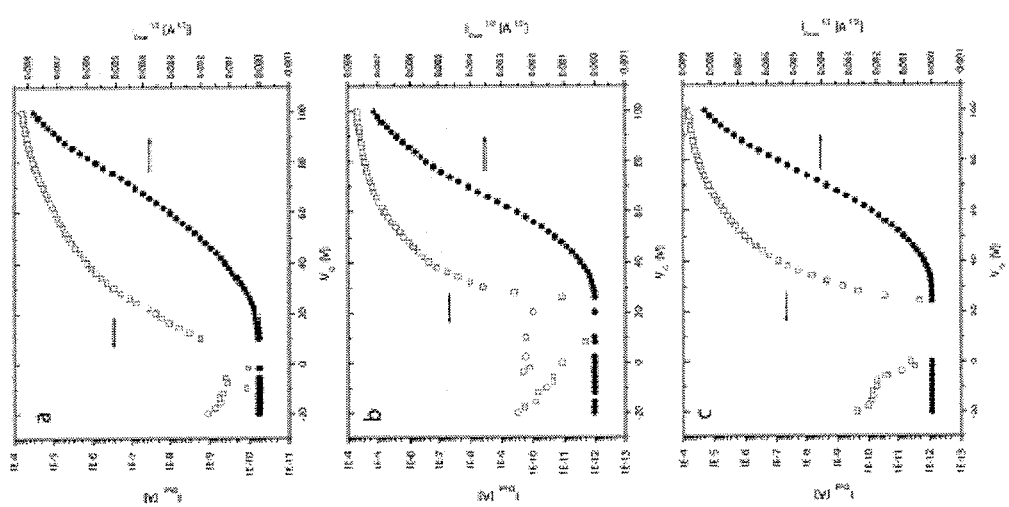
FIG. 8 shows the transfer characteristics for compound III-1.

Devices were fabricated according to the procedure described above, using exemplary compound III-1 deposited at various temperatures on an untreated wafer or on wafers treated with a silane reagent to form a self-assembled monolayer FIG. 8 shows the transfer characteristics for compound III-1 devices fabricated on an untreated, O-SAM, and F-SAM treated surfaces with a substrate temperature of 140° C.

The highest mobility achieved was for compound III-1 deposited on the O-SAM surface at 140° C., resulting in a mobility of 0.57 cm$^2$/Vs. A summary of the properties and conditions for OFETs of III-1, measured in air, is shown in FIG. 9. Along with the excellent mobilities, the measured on/off ratios were routinely greater or equal to 10$^6$, sometimes reaching values as high 10$^8$, which rivals or surpasses that of the best ratios reported to date. (Schmidt, R.; Ling, M. M.; Oh, J. H.; Winkler, M.; Konemann, M.; Bao, Z.; Wiirthner, F. Adv. Mater. 2007, 19, 3692-3695.; Wang, Z.; Kim, C.; Facchetti, A.; Marks, T. J. J. Am. Chem. Soc. 2007, 129, 13362-13363.)

Upon increasing the substrate temperature from 100 to 120° C., there is a substantial increase in both average and maximum mobilities, however at 140° C. the average mobility appears to level off while the maximum mobility makes a significant jump. We attempted to ensure uniform monolayer quality across all treated surface, realizing that small changes in monolayer quality may have a drastic affect on the mobility. It is conceivable that certain regions of any particular film may have more favorable silane/organic semiconductor interfaces leading to decreased charge trapping and enhanced mobilities. (Kumaki, D.; Ando, S.; Shimono, S.; Yamashita, Y.; Umeda, T.; Tokito, S. Appl. Phys. Lett. 2007, 90, 053506.) It is possible that some device-to-device variation was due to slight inhomogeneities in the silane monolayers.

Figure 10:
FIG. 10 shows a schematic of an exemplary low voltage device comprising compound III-1 on Al with only native oxide as added gate dielectric.

We utilized two different self assembled monolayer treatments, octadecyltrimethoxysilane and perfluorodecyltrimethoxysilane. Our results give further insight into the effects of monolayer surface treatment on device performance. Previously, Kobayashi et al. showed that different SAM functionalities can vary the carrier density at the semiconductor/insulator interface. (Kobayashi, S.; Nishikawa, T.; Takenobu, T.; Mori, S.; Shimoda, T.; Mitani, T.; Shimotani, H.; Yoshimoto, N.; Ogawa, S.; Iwasa, Y. Nat. Mater. 2004, 3, 317.) In the case of C60, the electron mobilities were significantly decreased for the F-SAM vs the untreated surface as a result of hole accumulation at the semiconductor/insulator interface due to the high induced dipole field originating from the F-SAM. In the case of our hybrid semiconductor-dielectric materials this is not the case, with the device mobilities equal to or exceeding those of films deposited on the untreated substrate. That the reduction in mobility is not observed for the F-SAM indicates that there is some other mechanism which enhances mobility. One possibility is that the matched surface energies of the fluorinated SAM and semiconductor enables a film morphology conducive to charge transport as evidenced by the images in FIG. 4, countering the hole accumulation due to the F-SAM. This is supported by the apparent larger crystalline domains for the SAM treated substrates from FIG. 4(e,f). The increase in grain size may be responsible for the mobility increase in the context of a grain boundary limited model, however a quantitative analysis would require a well defined grain size which is difficult to attain. (Horowitz, G.; Hajlaoui, M. E. Synth. Met. 2001, 122, 185-189.; Bourguiga, R.; Horowitz, G.; Garnier, F.; Hajlaoui, R.; Jemai, S.; Bouchriha, H. European Physical Journal-Applied Physics 2002, 19, 117-122.) In addition, there appear to be qualitative differences between the x-ray scans for films deposited on the various substrates.

perature of 140° C. Finally, source and drain electrodes were deposited using TEM grids as masks. A schematic of the device is shown in FIG. 10.

Figure 11:
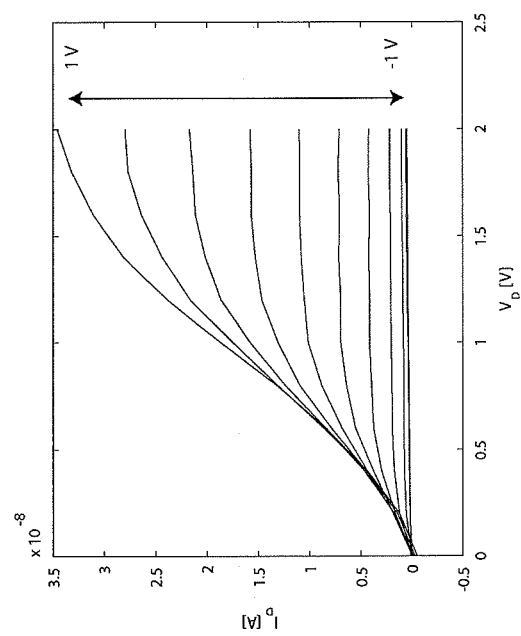
FIG. 11 shows an OFET characteristics of an exemplary low voltage device comprising compound III-1 on Al with only native oxide as added gate dielectric.
Figure 12:
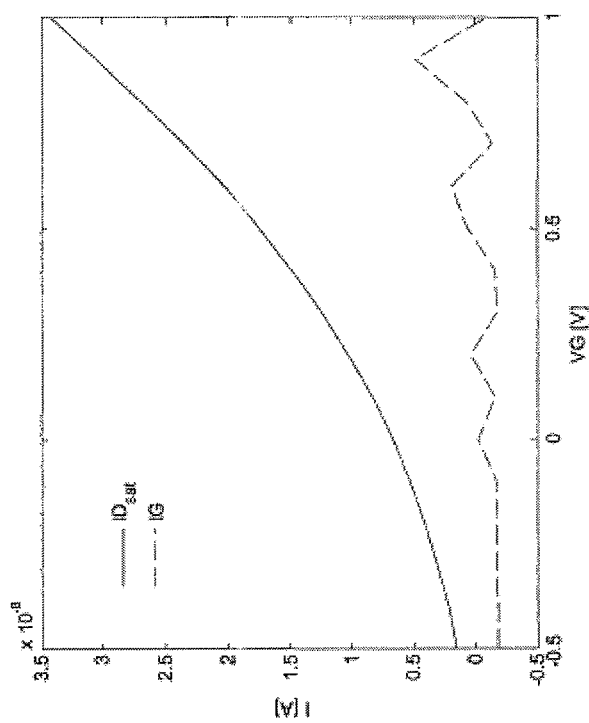
FIG. 12 show representative transfer characteristics of an exemplary low voltage device comprising compound III-1 on Al with only native oxide as added gate dielectric.

OFET characteristics of III-1 (F17-NTCDI) on Al with only native oxide as added gate dielectric are shown in FIG. 11. Clear linear and saturation regimes are observed for gate voltages below 1 V. FIG. 12 shows that the majority of the registered drain current is due to source/drain current as opposed to gate leakage.

G. Low Temperature Deposition

Example 11

Device Fabrication and Characterization

Highly n-type doped silicon wafers with 300 nm thermally grown $SiO_2$ dielectric layers were purchased from Process Specialities. The gate dielectric capacitance is calculated to be 11.5 $nF/cm^2$ assuming a dielectric constant 3.9 of $SiO_2$. Wafers were cleaned by piranha solution (sulfuric acid and 30% hydrogen peroxide (3:1)), deionized water, acetone, and isopropanol, followed by oxygen plasma. The cleaned substrates were treated with the vapor of Hexamethyldisilazane (HMDS) or octadecyltrimethoxysilane (OTS) to make the surface hydrophobic. Thin films (50 nm) of organic semiconductor II-1 were deposited by vacuum evaporation (0.3-0.6 Å/s) at various substrate temperatures. Gold top contact source and drain electrodes (50 or 20 nm) were evaporated through a shadow mask.

A summary of the characteristic of OTFT in air using various substrate depositions temperatures are shown in Table 1

TABLE 1

| Surface Treatment | $T_{sub}$ (° C.) | $\mu$ ($cm^2$/Vs) | Max $\mu$ ($cm^2$/Vs) | $I_{on}/I_{off}$ | $V_t$(V) | SS (V/decade) | # devices tested |
|---|---|---|---|---|---|---|---|
| HMDS | RT | 0.064 ± 0.017 | 0.077 | $10^5$ | 22-49 | 2.4-4.1 | 5 |
| | 40 | 0.052 ± 0.017 | 0.070 | $10^4$-$10^5$ | 22-35 | 3.1-6.9 | 7 |
| | 60 | 0.091 ± 0.020 | 0.11 | $10^5$-$10^7$ | 29-41 | 2.4-3.0 | 7 |
| | 80 | 0.15 ± 0.05 | 0.24 | $10^4$-$10^7$ | 34-0 | 1.9-6.7 | 7 |
| | 100 | 0.12 ± 0.02 | 0.14 | $10^4$-$10^7$ | 17-45 | 1.2-3.5 | 6 |
| | 120 | 0.19 ± 0.07 | 0.27 | $10^4$-$10^7$ | 10-42 | 1.6-4.6 | 7 |
| OTS | RT | 0.12 ± 0.03 | 0.14 | $10^4$-$10^7$ | 46-51 | 1.7-4.7 | 6 |
| | 40 | 0.19 ± 0.0.07 | 0.31 | $10^4$-$10^7$ | 31-52 | 1.7-5.4 | 12 |
| | 60 | 0.17 ± 0.05 | 0.20 | $10^5$-$10^7$ | 10-69 | 1.4-2.2 | 7 |
| | 80 | 0.20 ± 0.02 | 0.22 | $10^6$-$10^7$ | 9-56 | 1.5-2.3 | 5 |
| | 100 | 0.16 ± 0.01 | 0.16 | $10^5$-$10^7$ | 54-61 | 1.5-3.9 | 4 |
| | 120 | 0.22 ± 0.02 | 0.26 | $10^4$-$10^6$ | 15-55 | 1.7-4.7 | 8 |
| $OTS^a$ | RT | 0.11 ± 0.01 | 0.13 | $10^5$ | 10-11 | 1.4-1.5 | 8 |
| | 40 | 0.17 ± 0.02 | 0.22 | $10^5$-$10^6$ | 8-14 | 1.0-1.5 | 16 |
| | 80 | 0.13 ± 0.02 | 0.16 | $10^6$-$10^7$ | 5-8 | 0.6-1.1 | 6 |
| | 120 | 0.17 ± 0.02 | 0.20 | $10^6$-$10^7$ | 4-7 | 0.7-1.2 | 7 |

[a]From the scane of the transfer curve between −10 and 50 V of $V_g$ without having scanned the output curves up to 100 V of $V_g$, to minimize the possible effects of bias stress F. Devices Lacking a Separate Dielectric Layer Example 10

Device Fabrication and Characterization

Aluminum strips were deposited by thermal evaporation through silicon shadowmasks with dimensions approximately 200 μm×2500 μm. Samples were briefly exposed to air and then small gold gate contacts were deposited using the same masks blocked off with scotch tape. Samples were exposed to air again before deposition of organic. Approximately 30 nm of organic was deposited at a substrate tem- H. Flexible Substrate Example 12

Device Fabrication and Characterization

ITO (120 nm, 35 ohm/sq) on PET film (0.127 mm, Aldrich) was used as a substrate. A PMMA (Aldrich, $M_w$ 120,000) layer was spin coated at 2000 rpm from chlorobenzene solution (55 mg/mL) on ITO and baked at 70° C. for 30 min. The resulting thickness was about 230 nm. The capacitance of the PMMA dielectric layer was measured to be 11.4 $nF/cm^2$ at 10 kHz using an Agilent 4284A LCR meter. Thin films (50 nm) of organic semiconductor II-1 were deposited by vacuum evaporation (0.3-0.6 Å/s) at various substrate temperatures.

Gold top contact source and drain electrodes (50 or 20 nm) were evaporated through a shadow mask.

A summary of the characteristics of the flexible and transparent OTFT in air at various substrate deposition temperatures is shown in Table 2.

TABLE 2

| $T_{sub}$ (° C.) | µ (cm²/Vs) | Max µ (cm²/Vs) | $I_{on}/I_{off}$ | $V_1$ (V) | SS (V/decade) |
|---|---|---|---|---|---|
| RT | 0.078 ± 0.020 | 0.097 | $10^3$-$10^5$ | 11-18 | 1.2-2.5 |
| 40 | 0.12 ± 0.03 | 0.14 | $10^5$ | 16-18 | 1.2-1.8 |
| 60 | 0.15 ± 0.01 | 0.16 | $10^2$-$10^5$ | 6-14 | 1.4-6.3 |
| 80 | 0.19 ± 0.04 | 0.23 | $10^2$-$10^3$ | 4-14 | 2.7-3.6 |

Hybrid semiconducting-dielectric materials having tetracarboxylic diimide structures according to the invention may be synthesized with simple reactions with readily available starting materials resulting in excellent electron mobilities measured in air. Example compounds III-1 and IV-1, routinely exhibit mobilities greater than 0.1 cm²/Vs in air, with compound III-1 achieving a maximum mobility of 0.57 cm²/Vs and excellent on/off ratios ranging from $10^6$ to $10^8$. Additionally, X-ray diffraction (XRD) of thin films of III-1 (FIG. 6) reveals superior molecular ordering compared to other organic semiconductor films. Additional insight into packing motifs is drawn from the x-ray crystal structure of IV-1. The combination of simplicity of synthesis, air stability, and electronic performance puts these among the leading n-channel OFET semiconductors explored to date.

Example NTCDI compound III-1, has field-effect mobilities of 0.3-0.5 cm2/Vs in air on a variety of dielectrics. Additionally, the side chains of III-1 may themselves act as the principal part of the gate dielectric, giving compound III-1 an effective sheet transconductance (per gate volt) of 15 nS/V (nF/Vs) in a transistor (comparable to mobility of 1.5 cm²/Vs on $SiO_2$ with C=10 nF/cm²), with only the native oxide on silicon shielding the semiconductor from the gate. Compound III-1, therefore, is an example of the simultaneous deposition of semiconductor and a gate dielectric components involving n-channel materials and covalently bound side chains.

Similarly, example compounds IV-1 and II-1 show substantial electron mobilities. In an embodiment, compound II-1 may have the highest air-stable electron mobility on flexible plastic substrates, 0.3 cm²/Vs, and from deposition on room temperature substrates, 0.1 cm²/Vs.

The excellent performance of the compounds of the present invention illustrate important factors for the design of high performance electron carrying small molecules. For example, important factors for high mobility air stable n-channel materials can include the presence of perfluorinated branches at the terminal ends of the core molecule. (Katz, H. E.; Lovinger, A. J.; Johnson, J.; Kloc, C.; Siegrist, T.; Li, W.; Lin, Y. Y.; Dodabalapur, A. Nature 2000, 404, 478.; Jones, B. A.; Ahrens, M. J.; Yoon, M. H.; Facchetti, A.; Marks, T. J.; Wasielewski, M. R. Angewandte Chemie-International Edition 2004, 43, 6363-6366.) It is believed that the electron withdrawing nature of these groups lowers the LUMO of the molecule, making the film less susceptible to oxidation. (Ghosh, A.; Gassman, P. G.; Almlof, J. Journal Of The American Chemical Society 1994, 116, 1932-1940.) In the case of compound III-1 however, there is an analogous compound with a very similar structure, containing a perfluoroalkyl group attached to the nitrogen atoms of the NTCDI core. (Katz, H. E.; Lovinger, A. J.; Johnson, J.; Kloc, C.; Siegrist, T.; Li, W.; Lin, Y. Y.; Dodabalapur, A. Nature 2000, 404, 478.)

Compounds according to the invention can include a spacer, for example, a benzyl spacer and/or a longer perfluoroalkyl chain. In such a case, the electron withdrawing moiety has been moved further from the conjugated core, while the maximum saturation regime mobility for films deposited on untreated substrates is roughly five times greater. Given that, it may be less likely that electronic structure alterations are responsible for higher mobilities of exemplary compound III-1 in air. Instead, molecular packing may be an important consideration. This is evidenced by the enhanced crystallinity and interfacial ordering inferred from x-ray diffraction results. The perfluorination of the side chains, when present, may also play an important role in air stability, likely as a densely packed fluorocarbon barrier between the charge carrying core and environmental quenchers such as oxygen and water.

The embodiments above address a strategy for the synthesis of high mobility organic semiconductor materials that are stable in air. Using easily acquired starting materials and a straightforward reaction, some of the highest reported OFET electron mobilities in air have been achieved. With a maximum mobility of 0.57 cm2/Vs and on/off ratios as high as $10^8$ measured in air, these compounds rival the best reported in the literature to date.

What is claimed is:

1. An electronic or electro-optic device, comprising:

a first electrode;

a second electrode spaced apart from said first electrode;

a dielectric disposed between said first and second electrodes; and a layer of hybrid semiconducting-dielectric material disposed between said first and second electrodes, wherein said hybrid semiconducting-dielectric material comprises molecules, in the aggregate, provides an n-type semiconducting property and side chains that, in the aggregate, provide a dielectric property to said layer of hybrid semiconducting-dielectric material, wherein the side chains, in the aggregate, act as the principal dielectric between the first and second electrode; and wherein said hybrid semiconducting-dielectric material is an n-type organic semiconductor according to formula I:

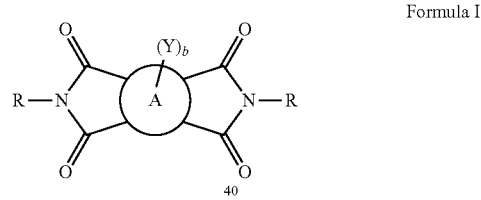

Formula I wherein A is a condensed aromatic moiety having 2-6 fused aromatic rings or heterocyclic variants thereof; and wherein Y is a substituent, and b is an integer from 0 to the number of unsubstituted carbon atoms on aromatic moiety A; and wherein R is selected from the group consisting of structures III and IV;

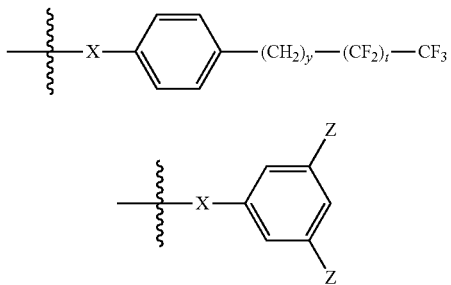

wherein X is —(CH$_2$)$_v$—, —(CH$_2$)$_w$—O—, or —(CH$_2$)$_w$—O—(CH$_2$)$_v$—; and wherein Z is OCF$_3$ or C$_n$F$_{(2n+1)}$ where n is 1, 2, 3 or 4; and wherein v is independently 1, 2, 3, or 4, and w is independently 2, 3, or 4; and wherein y is each independently 0, 1, 2, 3, or 4; and wherein t is an integer from 1 to 20.

2. The electronic or electro-optic device according to claim 1, wherein said molecules within said layer of hybrid semiconducting-dielectric material are aligned to form n-type semiconducting sublayers between adjacent dielectric sublayers.

3. The electronic or electro-optic device according to claim 1, wherein said dielectric layer is at least one of sodium beta-alumina, sodium beta-double-prime alumina, a native oxide layer or a self assembled monolayer.

4. The electronic or electro-optic device according to claim 1, further comprising a third electrode spaced apart from said first and second electrodes such that said layer of hybrid semiconducting-dielectric material is arranged between said third electrode and said second electrode.

5. The electronic or electro-optic device according to claim 4, wherein said electronic or electro-optic device is a field effect transistor.

6. The electronic or electro-optic device according to claim 4, wherein said first and third electrodes are in contact with said layer of hybrid semiconducting-dielectric material to provide drain and source electrodes, respectively, and said second electrode provides a gate electrode such that said electronic or electro-optic device is a field effect transistor.

7. The electronic or electro-optic device according to claim 1, further comprising a p-type semiconductor layer disposed between said first and second electrodes in contact with said layer of hybrid semiconducting-dielectric material such that said p-type semiconductor layer is in electrical contact with core sections of a plurality of said molecules of said hybrid semiconducting-dielectric material to provide an electronic or electro-optic device having a p-n junction.

* * * * *